United States Patent
Palaniappa

(10) Patent No.: US 9,877,404 B1
(45) Date of Patent: Jan. 23, 2018

(54) ADAPTER APPARATUS WITH SOCKET CONTACTS HELD IN OPENINGS BY HOLDING STRUCTURES

(71) Applicant: IRONWOOD ELECTRONICS, INC., Eagan, MN (US)

(72) Inventor: Ilavarasan M. Palaniappa, Inver Grove Heights, MN (US)

(73) Assignee: IRONWOOD ELECTRONICS, INC., Eagan, MN (US)

( * ) Notice: Subject to any disclaimer, the term of this patent is extended or adjusted under 35 U.S.C. 154(b) by 0 days.

(21) Appl. No.: 15/417,673

(22) Filed: Jan. 27, 2017

(51) Int. Cl.
| H01R 24/00 | (2011.01) |
| H05K 7/10 | (2006.01) |
| H01R 12/70 | (2011.01) |
| H01R 43/20 | (2006.01) |

(52) U.S. Cl.
CPC ........... *H05K 7/10* (2013.01); *H01R 12/7076* (2013.01); *H01R 43/20* (2013.01)

(58) Field of Classification Search
CPC ..................................................... H01R 12/57
USPC .................................. 439/686–689, 682, 752
See application file for complete search history.

(56) References Cited

U.S. PATENT DOCUMENTS

| 1,978,076 | A | * | 10/1934 | Cassedy, Jr. | ............ H01R 23/26 439/680 |
| 2,443,513 | A | * | 6/1948 | Quackenbush | ........ H01R 24/20 439/686 |
| 2,578,288 | A |   | 12/1951 | Cook | |
| 2,658,183 | A | * | 11/1953 | Klostermann | ..... H01R 33/7664 174/50 |
| 2,855,579 | A | * | 10/1958 | Wintriss | ................. H01R 13/26 29/884 |
| 2,951,817 | A |   | 9/1960 | Myers | |
| 3,104,925 | A | * | 9/1963 | MacNamara | ........ H01R 13/112 439/857 |
| 3,229,756 | A |   | 1/1966 | Keresztury | |
| 3,444,504 | A | * | 5/1969 | Erline | .................... H01R 13/28 439/248 |
| 3,621,444 | A | * | 11/1971 | Stein | .................... H05K 7/1038 439/109 |
| 3,728,509 | A |   | 4/1973 | Shimojo | |

(Continued)

FOREIGN PATENT DOCUMENTS

| EP | 0 905 826 A2 | 3/1999 |
| WO | WO 97/16849 | 5/1997 |
| WO | WO 99/66599 | 12/1999 |

OTHER PUBLICATIONS

Application Notes for Surface Mount Assembly of Amkor's *Micro*LeadFrame(MLF) Packages. Sep. 2002.

(Continued)

*Primary Examiner* — Neil Abrams
(74) *Attorney, Agent, or Firm* — Mueting, Raasch & Gebhardt, P.A.

(57) ABSTRACT

An adapter apparatus and method of forming the adapter apparatus includes providing a substrate with a plurality of layers. The layers include at least one socket contact holding layer that includes a plurality of holding structures positioned between a plurality of other layers. A plurality of socket contacts (e.g., each including an end connection portion and first and second deflectable element coupled thereto) are held in corresponding openings defined through the substrate at least in part by the plurality of holding structures.

20 Claims, 11 Drawing Sheets

(56) References Cited

U.S. PATENT DOCUMENTS

| | | | |
|---|---|---|---|
| 3,760,342 A | 9/1973 | Prouty et al. | |
| 3,869,192 A * | 3/1975 | Maier | H01H 73/08 |
| | | | 200/50.27 |
| 3,870,385 A | 3/1975 | Avakian et al. | |
| 3,971,610 A | 7/1976 | Buchoff et al. | |
| 4,007,977 A * | 2/1977 | Bauerle | H01R 13/112 |
| | | | 439/686 |
| 4,269,468 A * | 5/1981 | Ammon | H01R 12/58 |
| | | | 439/637 |
| 4,284,320 A * | 8/1981 | Nix | H01R 13/436 |
| | | | 439/686 |
| 4,295,699 A | 10/1981 | DuRocher | |
| 4,345,810 A | 8/1982 | Bakermans | |
| 4,460,223 A | 7/1984 | Brown et al. | |
| 4,514,784 A | 4/1985 | Williams et al. | |
| 4,519,660 A | 5/1985 | Ichimura et al. | |
| 4,550,959 A | 11/1985 | Grabbe et al. | |
| 4,641,909 A * | 2/1987 | Steffinger | H01R 13/424 |
| | | | 439/686 |
| 4,655,524 A | 4/1987 | Etzel | |
| 4,668,957 A | 5/1987 | Spohr | |
| 4,678,250 A | 7/1987 | Romine et al. | |
| 4,729,166 A | 3/1988 | Lee et al. | |
| 4,754,546 A | 7/1988 | Lee et al. | |
| 4,762,498 A | 8/1988 | Harting et al. | |
| 4,862,076 A | 8/1989 | Renner et al. | |
| 4,875,863 A | 10/1989 | Reed | |
| 4,878,861 A | 11/1989 | Kendall et al. | |
| 4,923,739 A | 5/1990 | Jin et al. | |
| 4,941,847 A * | 7/1990 | Welsh | H01R 13/41 |
| | | | 439/589 |
| 5,004,426 A * | 4/1991 | Barnett | H01R 12/585 |
| | | | 439/82 |
| 5,030,138 A | 7/1991 | Capp et al. | |
| 5,037,314 A | 8/1991 | Bricaud et al. | |
| 5,074,799 A | 12/1991 | Rowlette, Sr. | |
| 5,092,783 A | 3/1992 | Suarez et al. | |
| 5,109,320 A | 4/1992 | Bourdelaise et al. | |
| 5,123,849 A | 6/1992 | Deak et al. | |
| 5,127,837 A | 7/1992 | Shah et al. | |
| 5,129,833 A | 7/1992 | Rowlette, Sr. | |
| 5,137,462 A | 8/1992 | Casey et al. | |
| 5,140,405 A | 8/1992 | King et al. | |
| 5,155,661 A | 10/1992 | Nagesh et al. | |
| 5,160,281 A * | 11/1992 | Culver | F21S 48/1109 |
| | | | 439/692 |
| 5,163,837 A | 11/1992 | Rowlette, Sr. | |
| 5,286,218 A | 2/1994 | Sakurai et al. | |
| 5,313,099 A | 5/1994 | Tata et al. | |
| 5,318,456 A | 6/1994 | Mori | |
| 5,340,318 A | 8/1994 | Kunihiro | |
| 5,376,026 A | 12/1994 | Ohashi | |
| 5,377,900 A | 1/1995 | Bergmann | |
| 5,383,800 A * | 1/1995 | Saka | B60R 16/02 |
| | | | 439/76.2 |
| 5,387,861 A | 2/1995 | Neiderhofer | |
| 5,389,819 A | 2/1995 | Matsuoka | |
| 5,397,240 A | 3/1995 | Herard | |
| 5,397,245 A | 3/1995 | Roebuck et al. | |
| 5,397,919 A | 3/1995 | Tata et al. | |
| 5,418,471 A | 5/1995 | Kardos | |
| 5,432,679 A | 6/1995 | Grabbe | |
| 5,445,526 A | 8/1995 | Hoshino et al. | |
| 5,468,158 A | 11/1995 | Roebuck et al. | |
| 5,473,510 A | 12/1995 | Dozier, II | |
| 5,477,160 A | 12/1995 | Love | |
| 5,490,802 A * | 2/1996 | Plyler | H01R 13/4368 |
| | | | 439/752 |
| 5,528,462 A | 6/1996 | Pendse | |
| 5,548,223 A | 8/1996 | Cole et al. | |
| 5,566,052 A | 10/1996 | Hughes | |
| 5,588,878 A * | 12/1996 | Flinchbaugh | H01R 12/716 |
| | | | 439/636 |
| 5,597,324 A * | 1/1997 | Katsunori | H01R 13/5208 |
| | | | 439/587 |
| 5,636,996 A | 6/1997 | Johnson et al. | |
| 5,662,163 A | 9/1997 | Mira | |
| 5,667,870 A | 9/1997 | McCullough | |
| 5,691,041 A | 11/1997 | Frankeny et al. | |
| 5,699,227 A | 12/1997 | Kolman et al. | |
| 5,710,459 A | 1/1998 | Teng et al. | |
| 5,712,768 A | 1/1998 | Werther | |
| 5,725,393 A | 3/1998 | Steininger et al. | |
| 5,730,608 A | 3/1998 | Legrady | |
| 5,730,620 A | 3/1998 | Chan et al. | |
| 5,735,698 A | 4/1998 | Bakker et al. | |
| 5,741,141 A | 4/1998 | O'Malley | |
| 5,742,481 A | 4/1998 | Murphy et al. | |
| 5,745,346 A | 4/1998 | Ogawa et al. | |
| 5,761,050 A | 6/1998 | Archer | |
| 5,766,022 A | 6/1998 | Chapin et al. | |
| 5,770,891 A | 6/1998 | Frankeny et al. | |
| 5,783,461 A | 7/1998 | Hembree | |
| 5,791,914 A | 8/1998 | Loranger et al. | |
| 5,793,618 A | 8/1998 | Chan et al. | |
| 5,805,424 A | 9/1998 | Purinton | |
| 5,810,607 A | 9/1998 | Shih et al. | |
| 5,819,406 A | 10/1998 | Yoshizawa et al. | |
| 5,829,988 A | 11/1998 | McMillan et al. | |
| 5,833,471 A | 11/1998 | Selna | |
| 5,859,538 A | 1/1999 | Self | |
| 5,876,219 A | 3/1999 | Taylor et al. | |
| 5,877,554 A | 3/1999 | Murphy | |
| 5,879,172 A | 3/1999 | McKenna-Olson et al. | |
| 5,892,245 A | 4/1999 | Hilton | |
| 5,893,765 A | 4/1999 | Farnworth | |
| 5,896,037 A | 4/1999 | Kudla et al. | |
| 5,923,176 A | 7/1999 | Porter et al. | |
| 5,973,618 A | 10/1999 | Ellis | |
| 5,982,635 A | 11/1999 | Menzies et al. | |
| 6,007,348 A | 12/1999 | Murphy | |
| 6,007,389 A * | 12/1999 | Weber | H01R 43/20 |
| | | | 439/636 |
| 6,135,823 A * | 10/2000 | Torii | H01R 12/716 |
| | | | 439/58 |
| 6,155,887 A * | 12/2000 | Cuff | H01R 12/585 |
| | | | 439/751 |
| 6,196,886 B1 | 3/2001 | Sato | |
| 6,231,370 B1 * | 5/2001 | Morin | H01R 12/57 |
| | | | 361/807 |
| 6,264,490 B1 | 7/2001 | Lemke et al. | |
| 6,325,280 B1 | 12/2001 | Murphy | |
| 6,351,392 B1 | 2/2002 | Palanpiappa et al. | |
| 6,394,820 B1 | 5/2002 | Palanpiappa et al. | |
| 6,491,536 B1 * | 12/2002 | Torii | H01R 12/58 |
| | | | 439/246 |
| 6,511,330 B1 * | 1/2003 | Norris | H01R 12/585 |
| | | | 439/76.1 |
| 6,533,589 B1 | 3/2003 | Palanpiappa et al. | |
| 6,609,922 B2 * | 8/2003 | Torii | H01R 13/6315 |
| | | | 439/247 |
| 6,623,280 B2 | 9/2003 | Oldenburg et al. | |
| 6,644,981 B2 | 11/2003 | Choy | |
| 6,877,993 B2 | 4/2005 | Palaniappa et al. | |
| 6,971,922 B2 * | 12/2005 | Shimizu | H01R 12/716 |
| | | | 439/682 |
| 7,063,575 B2 * | 6/2006 | Powers | H01R 13/113 |
| | | | 439/699.2 |
| 7,083,434 B1 | 8/2006 | Blossfeld | |
| 7,368,814 B1 | 5/2008 | Tully et al. | |
| 7,537,461 B2 * | 5/2009 | Rathburn | H01R 13/2414 |
| | | | 439/66 |
| 7,874,880 B2 * | 1/2011 | Fedde | G01R 1/0483 |
| | | | 439/66 |
| 8,091,222 B2 | 1/2012 | Fedde et al. | |
| 8,167,630 B2 | 5/2012 | Lemke et al. | |
| 8,790,132 B2 * | 7/2014 | Kashiyama | H01R 13/748 |
| | | | 439/545 |
| 9,048,545 B2 | 6/2015 | Palaniappa et al. | |
| 9,048,565 B2 * | 6/2015 | Palaniappa | H01R 12/57 |
| 9,054,438 B2 * | 6/2015 | Endo | H01R 12/91 |

(56) References Cited

U.S. PATENT DOCUMENTS

| | | | |
|---|---|---|---|
| 9,515,406 B2* | 12/2016 | Yu | H01R 13/41 |
| 9,742,081 B1* | 8/2017 | Annis | H01R 12/585 |
| 2005/0221690 A1 | 10/2005 | Suzuki et al. | |
| 2009/0197479 A1* | 8/2009 | Glick | H01R 4/185 |
| | | | 439/752 |
| 2014/0370725 A1 | 12/2014 | Palaniappa et al. | |
| 2015/0200485 A1* | 7/2015 | Yu | H01R 13/521 |
| | | | 439/521 |

OTHER PUBLICATIONS

Ironwood Electronics, Inc. VLSI Interconnection Specialists Catalog XII (pp. 84, 110) (product on p. 110 available at least as early as Oct. 4, 1998).

Ironwood Electronics, Inc. VLI Interconnection Specialists Product Brochure, Spring 1998. 6 pages.

Herard et al., "Interconnection Technology: Using dendrites to bridge the gaps," *Printed Circuit Fabrication*, 1995;18(9):22-24.

Jarvela R.A., "Module Holder and Actuator," *Technical Disclosure Bulletin*, 1974;16(12):3975-3976.

Lau, John H. ed., "A brief introduction to Ball Grid Array Technologies," *ball Grid Array Technology*, 1995;pp. xii-i-xvi:1-57.

* cited by examiner

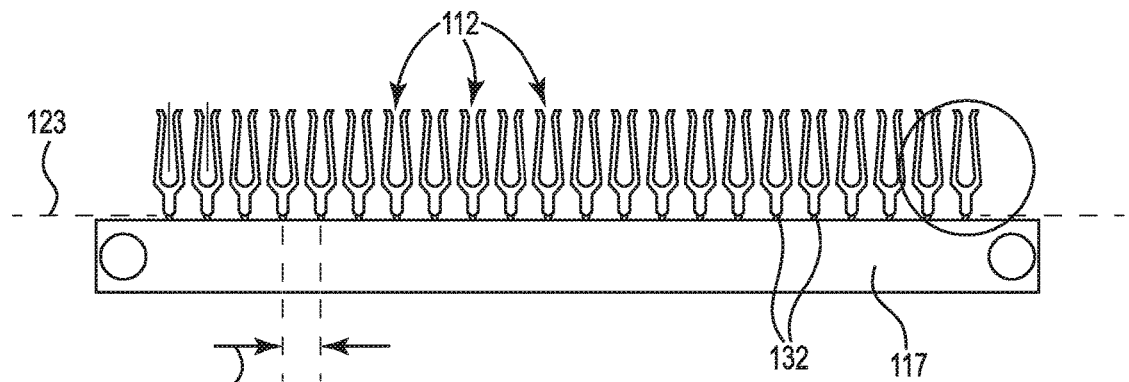
FIG. 6A
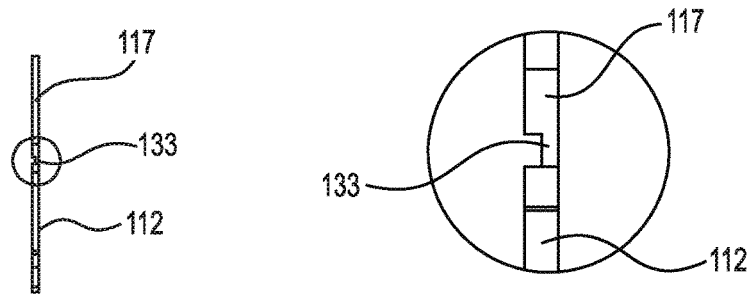
FIG. 6B  FIG. 6C

ADAPTER APPARATUS WITH SOCKET CONTACTS HELD IN OPENINGS BY HOLDING STRUCTURES

BACKGROUND

The present invention relates generally to adapters for use with packaged devices or other adapter apparatus (e.g., male pin adapters).

Certain types of integrated circuit packages are becoming increasingly popular due to their occupancy area efficiency. In other words, they occupy less area on a target board on which they are mounted while providing a high density of contact terminals. For example, such high density package types may include a ball grid array, land grid array package, chip scale package, or wafer level package.

Generally, for example, ball grid array packages contain an integrated circuit having its die bond pads electrically connected to respective conductive solder spheres that are distributed on the bottom surface of the package in an array. A target printed circuit board typically has formed on its surface a corresponding array of conductive pads which align with the array of solder spheres for electrically mounting the ball grid array package on the target board.

The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder spheres are melted and fused to the conductive pads of the target board.

Such area efficient packaging (e.g., ball grid array packages) provide a high density of terminals at a very low cost. Also, this packaging provides for limited lead lengths. Limited lead lengths may reduce the risk of damage to such leads of the package, may provide for higher speed product, etc.

Circuit boards and/or components mounted thereon may be tested by designers as the circuit boards are being developed. For example, for a designer to test a circuit board and/or a ball grid array package mounted thereon, the designer must first electrically connect the solder spheres on the ball grid array package to the target circuit board. As described above, this generally includes mounting the ball grid array package on the target board and heating the solder spheres to fuse the solder spheres to the conductive pads of the target board. Therefore, the package may be prevented from being used again. It is desirable for various reasons to use package adapters for mounting the packages and reuse ball grid array packages after testing. For example, such ball grid array packages may be relatively expensive. Further, for example, once attached, the solder spheres are not accessible for testing. In addition, it is often difficult to rework the circuit board with packages soldered thereon.

Various adapters which have been described for electrically connecting high density packaged devices to a target printed circuit board are known. Various intercoupling components are used to provide such adapters. For example, U.S. Pat. No. 6,007,348 to Murphy, issued 28 Dec. 1999, entitled "Solder Sphere Terminal," and U.S. Pat. No. 6,325,280 to Murphy, issued 4 Dec. 2001, entitled "Solder Sphere Terminal" describe several adapter apparatus for use in mounting ball grid array packages, as well as intercoupling components of other conventional adapter devices; in many instances such adapters have terminals (e.g., female socket pins) configured for receiving a mating terminal (e.g., female socket pins configured to receive male pins). For example, such female socket pins may be press-fit into openings formed in an insulative material so as to provide a contact for receiving a male pin. Further, for example, U.S. Pat. No. 7,874,880 to Fedde et al., issued 25 Jan. 2011, entitled "Adapter Apparatus with Sleeve Spring Contacts," and U.S. Pat. No. 9,048,565 to Palaniappa et al., issued 2 Jun. 2015, entitled "Adapter Apparatus with Deflectable Element Socket Contacts," describe yet other alternative adapter apparatus for use in mounting ball grid array packages, as well as intercoupling components of other conventional adapter devices, such as for receiving a mating terminal (e.g., to receive male pins).

Conventional female pin contacts are generally constructed with use of a stamped clip which is formed in a circle with separate fingers which are pushed aside when a male pin is inserted. For example, such a clip is generally manufactured using a stamping or rolling process (e.g., with a material such as berylium copper alloy).

However, such clip manufacturing can be prohibitively costly due to the necessary tooling required when the sockets in which the female socket pins are used have a very small pitch (e.g., in the 0.5 millimeter range). Further, the tooling to form such female socket clips can be difficult to miniaturize because of the inherent inaccuracies of stamping very small parts.

Still further, a socket pin press-fit into openings in a substrate may result in one or more problems. For example, press-fit pins may cause stresses to occur in the substrate into which the press-fit pins have been inserted. Such stresses during assembly, as well as over time, may result in warping issues related to the substrate of the adapter.

SUMMARY

The disclosure herein relates generally to adapter apparatus that use holding structures to hold socket contacts (e.g., flat deflectable element socket contacts) within a substrate formed of a plurality of layers. For example, such a manner of holding contacts in the substrate may overcome the problems associated with press-fitting of contacts within openings of a substrate. In other words, in the embodiments described herein, each of the plurality of socket contacts is not press-fit within a corresponding opening of a substrate.

One exemplary adapter apparatus described herein may include a substrate having a pin receiving side and a connection side opposite the pin receiving side. A plurality of openings may be defined through the substrate between the pin receiving side and the connection side. The substrate may be formed of a plurality of layers, such layers may include at least one end connection retention guide layer that includes a plurality of end connection receiving openings, at least one deflection element receiving layer that includes a plurality of deflection element receiving openings, and at least one socket contact holding layer that includes a plurality of holding structures positioned between the at least one end connection retention guide layer and the at least one deflection element receiving layer.

Further, the exemplary adapter apparatus may include a plurality of socket contacts (e.g., wherein each of the plurality of socket contacts may be provided within a corresponding opening of the plurality of openings of the substrate). Each of the plurality of socket contacts may include an end connection portion (e.g., wherein at least a part of the end connection portion may be received in one of the plurality of end connection receiving openings), and first and second deflectable elements configured to be received in one of the plurality of deflectable element receiving openings (e.g. wherein the first deflectable element and the second deflectable element may be coupled to the end connection portion to define a socket opening configured to receive a male pin therein). The socket contact (e.g., a flat socket contact) may be held in the corresponding opening of the substrate by a portion of the end connection retention guide layer and one of the plurality of holding structures of the socket contact holding layer. Further, the first and second deflectable elements deflect when a male pin is received in the socket opening and in contact between the first and second deflectable elements.

Still further, in one or more additional embodiments, each of the socket contacts may be formed with additional deflectable elements, e.g., such as third and fourth deflectable elements coupled to an end connection portion that may mate or otherwise be coupled to the end connection portion associated with the first and second deflectable elements, to define a socket opening configured to receive a male pin therein. For example, the first and second deflectable elements and the end connection portion associated therewith may be formed as a first flat contact portion and, for example, the third and fourth deflectable elements and the end connection portion associated therewith, may be formed as a second flat contact portion. Further, for example, the first and second flat contact portions may be arranged orthogonal to one another to provide a four deflectable element socket opening configured to receive a male pin therein.

One exemplary method for use in forming an adapter apparatus may include one or more of the following processes or features: providing a plurality of layers, which layers may include at least one end connection retention guide layer that includes a plurality of end connection receiving openings, at least one deflection element receiving layer that includes a plurality of deflection element receiving openings, and at least one socket contact holding layer that includes a plurality of holding structures (e.g., each holding structure may include a holding element and one or more openings defined adjacent thereto); and providing a plurality of socket contacts, which socket contacts (e.g., flat socket contacts) may include an end connection portion (e.g., wherein at least a part the end connection portion may be configured to be received in one of the plurality of end connection receiving openings) and first and second deflectable elements configured to be received in one of the plurality of deflectable element receiving openings (e.g., wherein the first deflectable element and the second deflectable element may be coupled to the end connection portion to define a socket opening configured to receive a male pin therein).

The exemplary method may further include coupling the at least one socket contact holding layer and the at least one deflection element receiving layer such that the one or more openings of each holding structure of the plurality of holding structures are aligned with a corresponding deflection element receiving opening of the plurality of deflection element receiving openings; inserting the first and second deflectable elements of each of the plurality of socket contacts through one or more openings of a corresponding holding structure of the plurality of holding structures of the socket contact holding layer such that the holding element of the corresponding holding structure is in contact with a portion of the socket contact within the socket opening; and coupling the at least one end connection retention guide layer to the socket contact holding layer such that at least a part of the end connection portion of each of the plurality of socket contacts is received within a corresponding end connection receiving opening of the plurality of end connection receiving openings of the at least one end connection retention guide layer (e.g., wherein the first and second deflectable elements of the socket contact may be located within a corresponding deflection element receiving opening of the plurality of deflection element receiving openings of the at least one deflection element receiving layer). In one or more further embodiments, additional deflectable elements may be inserted, e.g., such as third and fourth deflectable elements as described herein to provide, for example, a four deflectable element socket opening configured to receive a male pin therein).

In one or more embodiments of the adapter apparatus and/or methods for forming the adapter apparatus, the cross-section area of each of the plurality of end connection receiving openings orthogonal to an axis along which the socket contact lies between the pin receiving side and the connection side may be smaller than a cross-section area of each of the plurality of deflection element receiving openings orthogonal to the axis along which the socket contact lies.

Further, in one or more embodiments of the adapter apparatus and/or methods for forming the adapter apparatus, each of the plurality of holding structures of the at least one socket contact holding layer may include a holding element separating a pair of openings through which the first and second deflectable elements are respectively inserted.

Further, in one or more embodiments of the adapter apparatus and/or methods for forming the adapter apparatus, each of the plurality of socket contacts may be held in the corresponding opening of the substrate by a portion of the at least one end connection retention guide layer and a holding element of one of the plurality of holding structures of the at least one socket contact holding layer extending within at least part of the socket opening proximate the coupling of the first and second deflectable elements to the end connection portion.

Still further, in one or more embodiments of the adapter apparatus and/or methods for forming the adapter apparatus, each of the plurality of socket contacts may include an open end configured to receive the male pin therein and a closed end opposite the open end and towards the end connection portion of the socket contact. Each of the plurality of socket contacts may be held in the corresponding opening of the substrate by a portion of the at least one end connection retention guide layer and a holding element of one of the plurality of holding structures of the at least one socket contact holding layer in contact with a portion of the closed end.

Yet further, in one or more embodiments of the adapter apparatus and/or methods for forming the adapter apparatus, one or more of the following features may be provided: each of the plurality of deflection element receiving openings may include a center pin receiving region and first and second deflection regions (e.g., wherein each of the first and second deflection regions may be defined by one or more deflection region surfaces opposite the other and adjacent the center pin receiving region); the first deflectable element may be coupled to the end connection portion and provided at least partially in the first deflection region and the second deflectable element may be coupled to the end connection portion and provided at least partially in the second deflection region; the first and second deflectable elements may be spaced apart by a greater distance towards the connection side of the substrate than towards the pin receiving side of the substrate (e.g., wherein the first and second deflectable elements may be spaced apart by a distance that is less than the diameter of a male pin to be received thereby towards the pin receiving side of the substrate); wherein each of the first and second deflectable elements may include an elongate portion coupled to the end connection portion by a transition portion and the end connection portion may be centered at the connection side of the substrate relative to the center pin receiving region; and/or a holding element of one of the plurality of holding structures may be positioned between the transition portions coupling the elongate portions of the first and second deflectable elements to the end connection portion and in contact with the socket contact to hold the socket contact in the corresponding opening of the substrate.

Still further, in one or more embodiments of the adapter apparatus and/or methods for forming the adapter apparatus, a length of the end connection portion in the direction of an axis along which the socket contact lies between the pin receiving side and the connection side may be greater than a thickness of the at least one end connection retention guide layer in the direction of the axis of the socket contact. For example, at least a part of the end connection portion of each of the plurality of socket contacts may extend through and out of the corresponding end connection receiving opening of the plurality of end connection receiving openings of the at least one end connection retention guide layer.

Yet still further, in one or more embodiments of the adapter apparatus and/or methods for forming the adapter apparatus, at least a portion of each of the plurality of socket contacts may be sandwiched between a holding element of one of the plurality of holding structures of the at least one socket contact holding layer and one or more portions of the at least one end connection retention guide layer.

Yet further, in one or more embodiments of the adapter apparatus and/or methods for forming the adapter apparatus, the at least one end connection retention guide layer may be coupled to the socket contact holding layer using a layer of pre-preg material.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

FIGS. 6A-6C show a plan view, a side view, and a more detailed view of a portion of the side view, respectively, of another exemplary embodiment of a plurality of deflectable element socket contacts attached to a holding member usable to provide an adapter apparatus such as the adapter apparatus of FIGS. 2A-2C.

DETAILED DESCRIPTION OF EXEMPLARY EMBODIMENTS

Figure 1A:
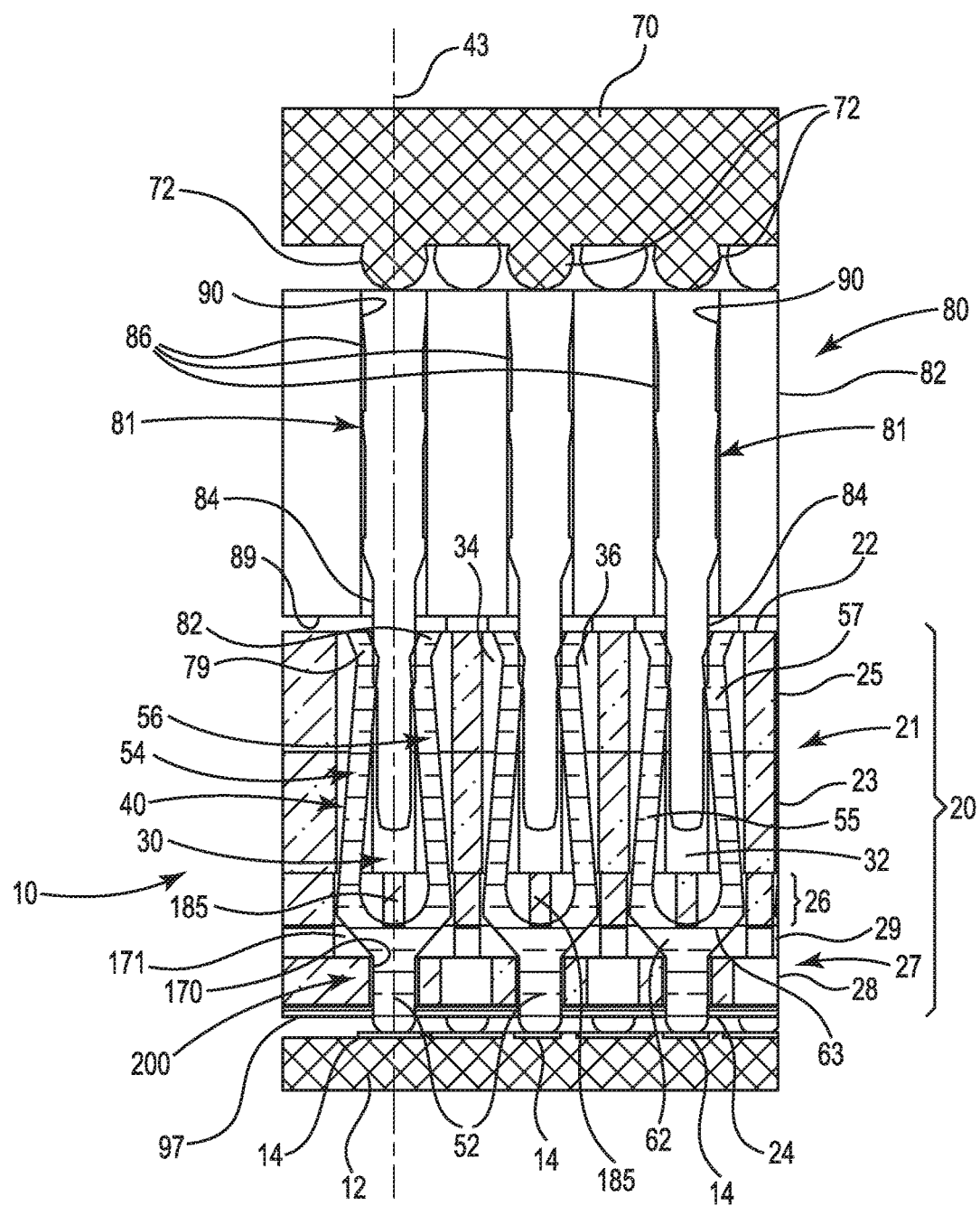
FIG. 1A is a generalized illustrative cross-section diagram of one exemplary embodiment of a portion of an adapter apparatus including deflectable element socket contacts for use in mounting a packaged device relative to a target board.

In the following detailed description of illustrative embodiments, reference is made to the accompanying figures of the drawing which form a part hereof, and in which are shown, by way of illustration, specific embodiments which may be practiced. It is to be understood that other embodiments may be utilized and structural changes may be made without departing from (e.g., still falling within) the scope of the disclosure presented hereby.

Exemplary adapter apparatus and methods for providing same shall generally be described with reference to FIGS. 1-7. It will be apparent to one skilled in the art that elements from one embodiment may be used in combination with elements of the other embodiments, and that the possible adapter apparatus embodiments using features set forth herein is not limited to the specific embodiments described (e.g., more than two deflectable elements may be used in the floating deflectable socket contact as shown and described with reference to FIG. 7). Further, it will be recognized that the embodiments described herein will include many elements that are not necessarily shown to scale. Further, it will be recognized that the size and shape of various elements herein may be modified without departing from the scope of the present disclosure, although one or more shapes and sizes may be advantageous over others.

FIG. 1 shows a generalized diagrammatic view of an exemplary adapter apparatus 10. The adapter apparatus 10 includes a substrate 20. Substrate 20 comprises a plurality of layers of material extending between a first surface or pin receiving side 22 and a second surface or a connection side 24. In one embodiment of substrate 20, the first and second surfaces are planer surfaces that generally lie parallel to one another.

The substrate 20, or the plurality of layers thereof, may be formed of any suitable insulative material (e.g., polyimide materials, laminate materials, etc.). In one embodiment, one or more layers of the substrate 20 may be formed of a high temperature material (e.g., a material that is suitable for use in temperatures that exceed 125 degrees C.). For example, the one or more layers of the substrate 20 may be formed of one or more materials such as polyetheretherketone (PEEK), Ceramic filled PEEK or other grades of PEEK, Torlon, FR4, G10, Kapton, or Rogers R04350. Further, in one or more embodiments, the substrate 20 may be formed of multiple layers of laminate materials (e.g., such laminate materials may be partially cured, for example, half cured, at the start of manufacturing the assembly and later fully cured such as after the socket contacts are inserted). Further, for example, when laminating multiple layers, one or more of the layers may be partially cured (e.g., half cured), referred to herein as pre-preg materials (e.g., pre-impregnated composite fibers, partially cured for use during assembly, and then later cured).

In one embodiment, the substrate 20 may be of a size generally equivalent to a packaged device (e.g., packaged device 70) which is to be mounted using the adapter apparatus 10. However, one skilled in the art will recognize that the size and shape of the substrate 20 may vary based on the application of the adapter apparatus (e.g., the adapter apparatus may be configured to mount more than one packaged device, may be adapted to mount different types of packages, etc.).

The present invention may be used to mount various types of packaged devices, including, but not limited to, for example, surface mount devices, such as ball grid array packages, land grid array packages, quad flat no leads (QFN) devices, column grid array packages, non-solder ball packages, other packaged devices with surface mount pads, etc. One will recognize that the configuration of the adapter apparatus may be different depending on the type of the packaged device being mounted (e.g., the apparatus being different or the same for a package including solder balls versus a non-solder ball package).

As shown in FIGS. 1-4, in one or more embodiments, the substrate 20 includes a plurality of openings 15 (see, e.g., FIG. 1B) defined through the substrate 20 in which a plurality of socket contacts 40 (e.g., deflectable element socket contacts) are provided. In various figures of this application, for simplicity, only several openings 15 have socket contacts 40 provided therein (see, e.g., FIG. 1B). However, all or just some of such openings 15 may have socket contacts 40 therein.

Figure 1B:
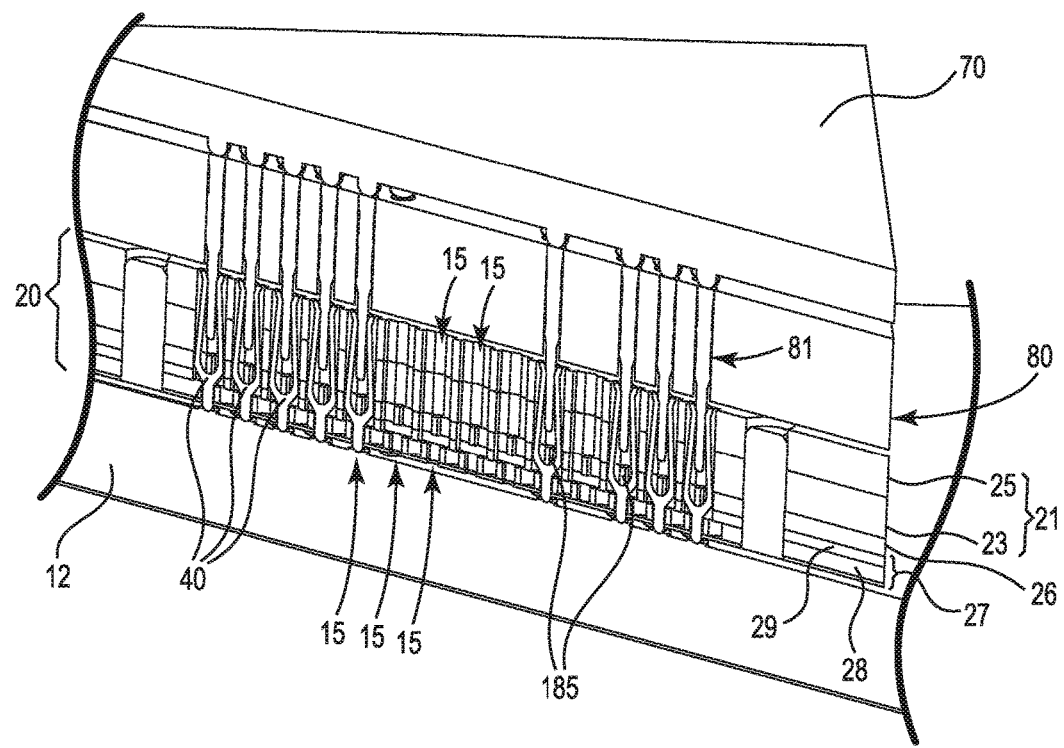
FIG. 1B is a generalized illustrative perspective cross-section diagram of one exemplary embodiment of a larger portion of an adapter apparatus such as shown in FIG. 1A including deflectable element socket contacts for use in mounting a packaged device relative to a target board.

The openings 15, for example, as shown in FIG. 1A-1B, are defined through substrate 20 from pin receiving side 22 to connection side 24 of the substrate 20; the pin receiving side 22 being opposite the connection side 24. The size and shape of the openings 30 may be dependent upon the structure of the socket contacts 40 (e.g., deflectable element socket contacts) to be provided in corresponding openings 15.

The openings 15 may be provided by openings defined in the plurality of layers forming the substrate 20. For example, each layer forming the substrate 20 may have one or more openings defined therein which form a part of an opening 15 defined through substrate 20 from pin receiving side 22 to connection side 24 of the substrate 20. Any number of layers may be used to form the substrate 20 and any number of openings may be provided in such layers to provide the openings 15 defined through substrate 20.

As shown in FIGS. 1-4, the plurality of layers forming substrate 20 may include at least one end connection retention guide layer 27 that includes a plurality of end connection receiving openings 200 defined by at least surfaces 170. For example, the at least one end connection retention guide layer 27 may include a primary guide layer 28 as well as one or more other layers, such as a pre-preg layer 29. In such a configuration, the plurality of end connection receiving openings 200 are provided by at least surfaces 170 defined through the primary guide layer 28 and surfaces 171 defined through pre-preg layer 29. The plurality of end connection receiving openings 200 are configured to receive at least a part of an end connection portion 52 of a socket contact 40 as described further herein.

Further, as shown in FIGS. 1-4, the plurality of layers forming substrate 20 may include at least one deflection element receiving layer 21 that includes a plurality of deflection element receiving openings 30 provided by surfaces defined therethrough. For example, the at least one deflection element receiving layer 21 may include one or more layers. In the configuration shown in FIGS. 1-4, the at least one deflection element receiving layer 21 includes a first layer 23 and a second layer 25, and the plurality of deflection element receiving openings 30 are provided by surfaces defined through the first layer 23 and surfaces defined through the second layer 25. The deflection element receiving openings 30 are configured to receive at least a part of deflectable elements 54 and 56 of a socket contact 40 as described further herein.

Figure 2A:
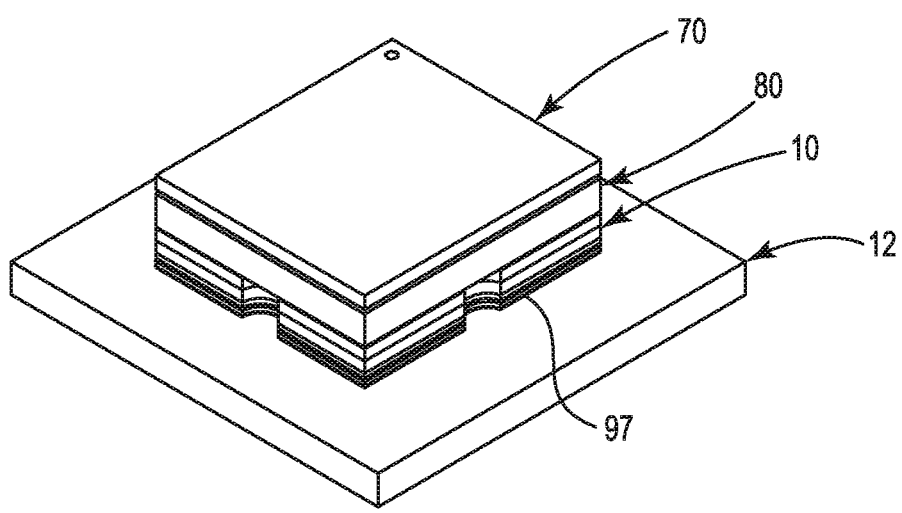
FIG. 2A is a perspective view of one exemplary embodiment of an adapter apparatus including features such as illustratively shown in FIGS. 1A-1B.
Figure 2B:
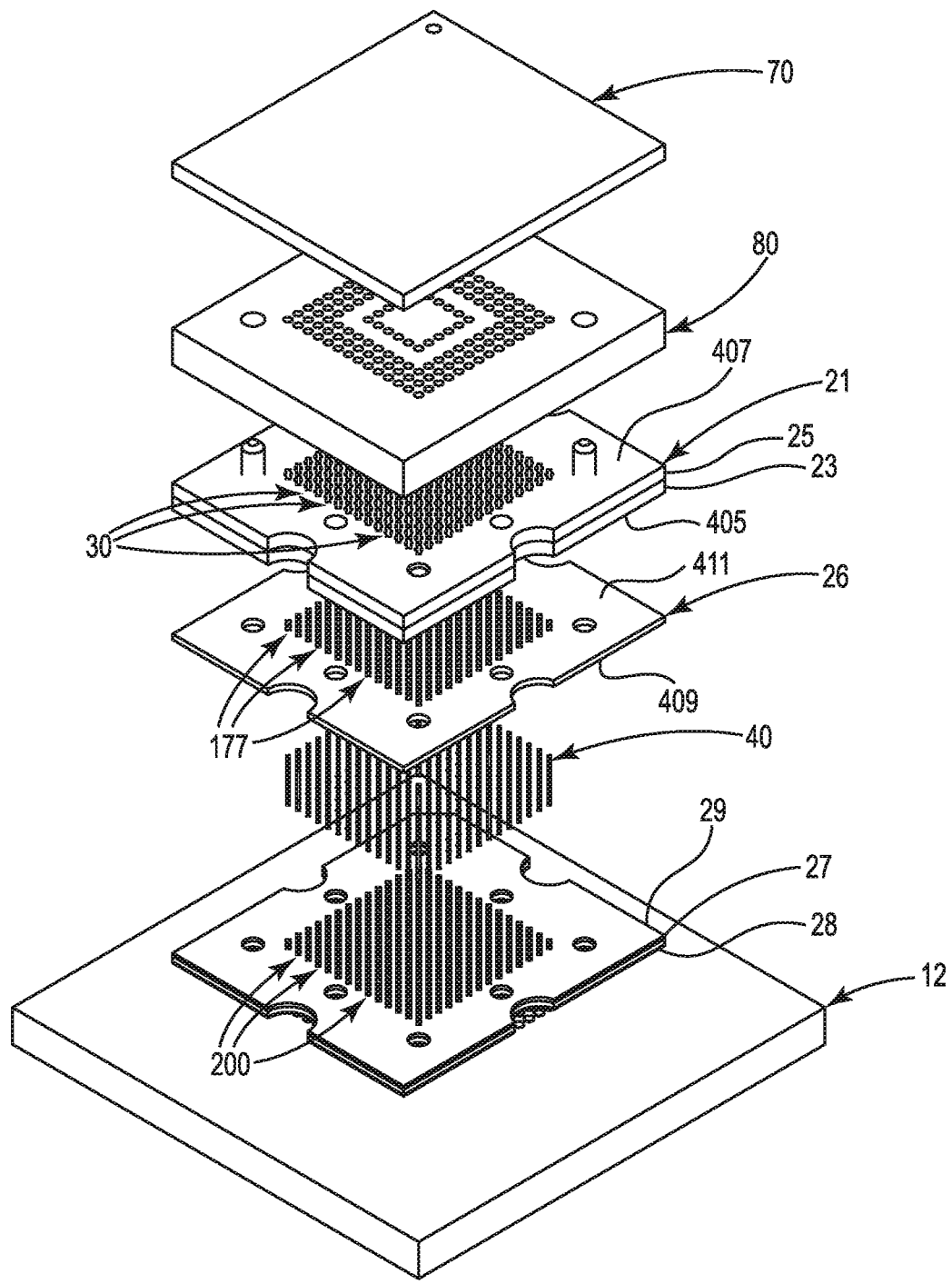
FIG. 2B is an exploded perspective view of the exemplary embodiment of an adapter apparatus shown in FIG. 2A.
Figure 2C:
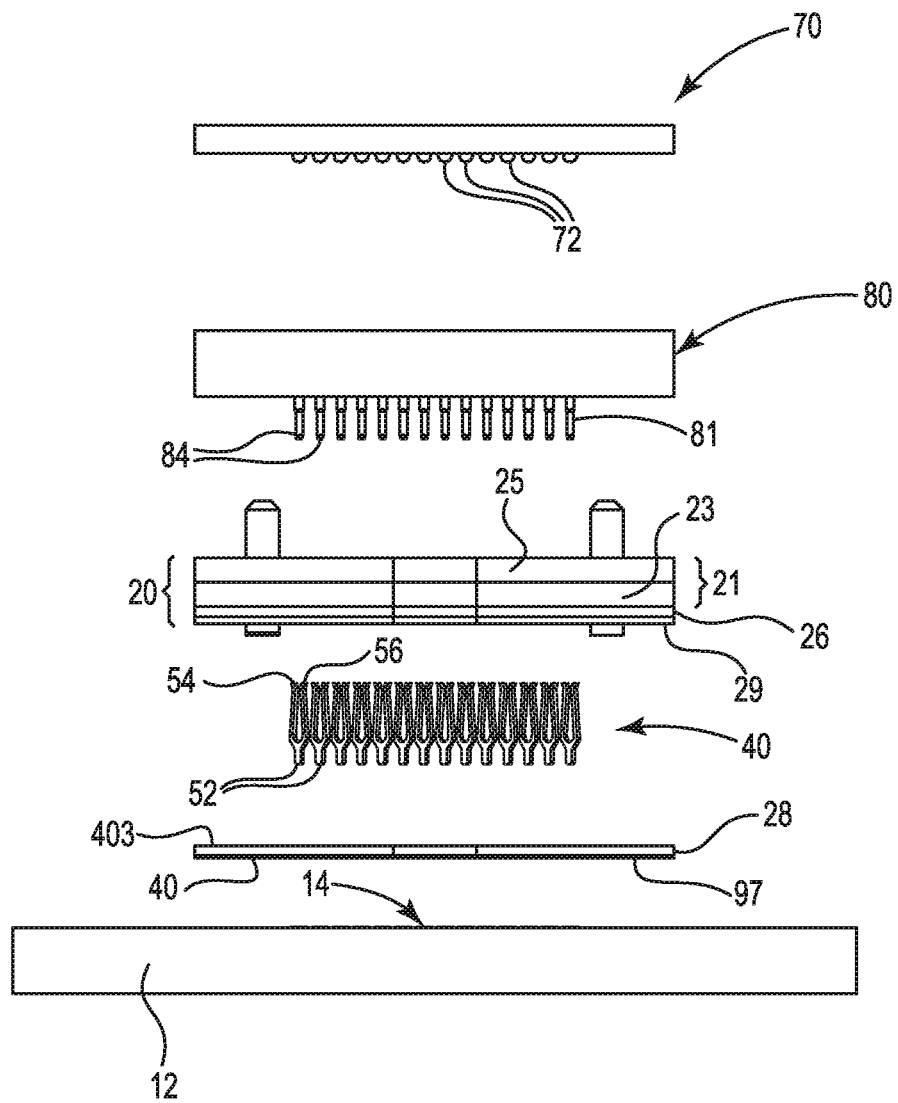
FIG. 2C is an exploded side view of the exemplary embodiment of an adapter apparatus shown in FIG. 2A.
Figure 3A:
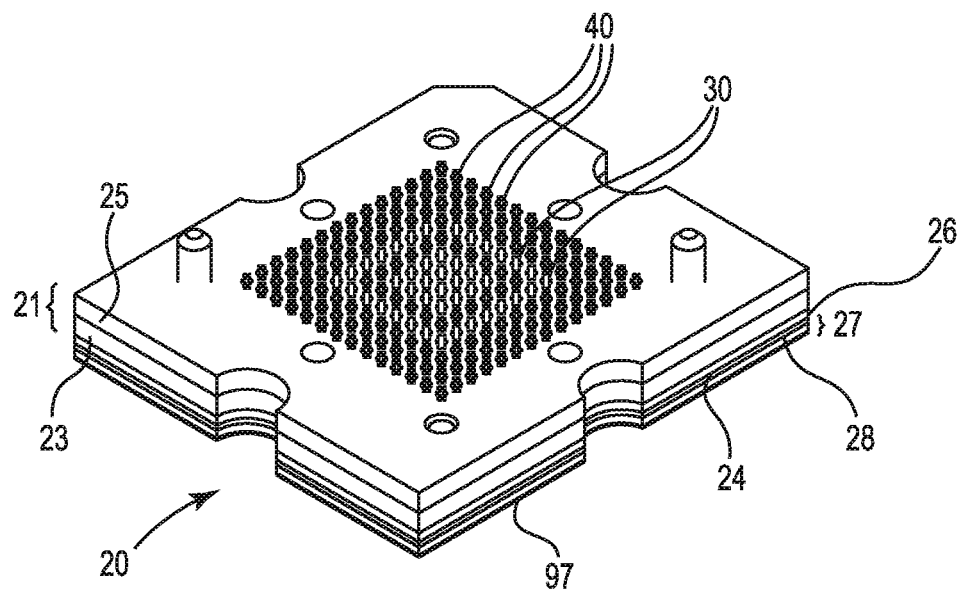
FIGS. 3A-3D show a perspective view, plan view, a more detailed plan view of a portion thereof, and yet still a more detailed plan view of one opening of such a portion, respectively, of an exemplary embodiment of a substrate usable to provide an adapter apparatus such as the adapter apparatus of FIGS. 2A-2C.
Figure 3B:
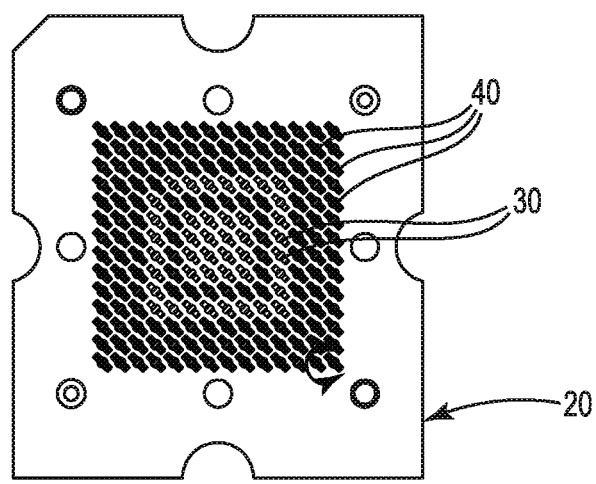
Figure 3C:
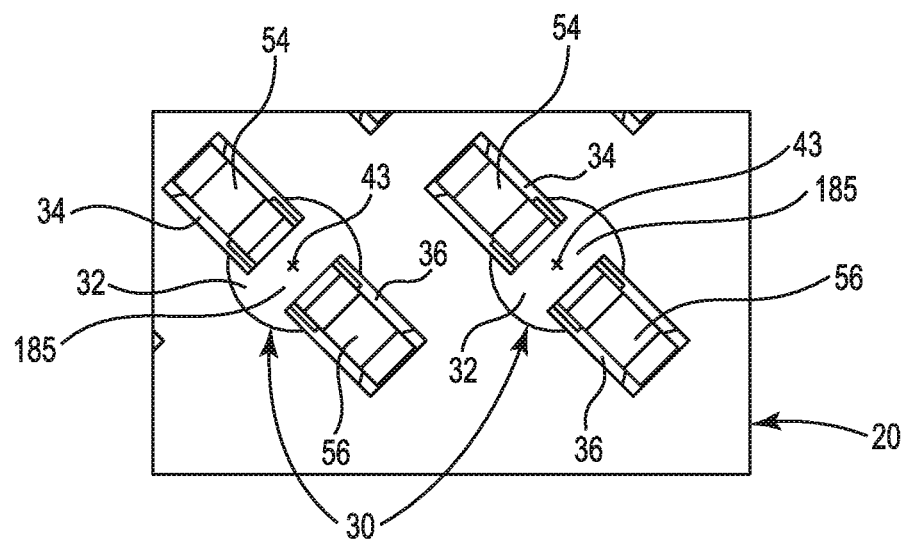
Figure 3D:
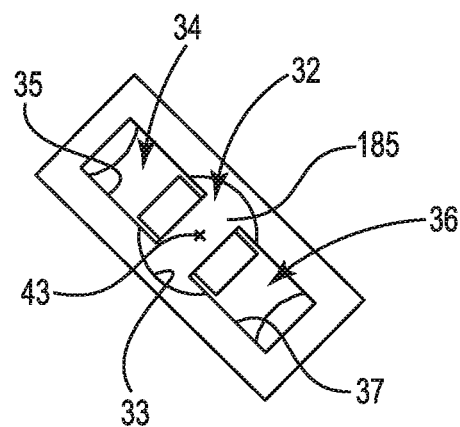
Figure 4A:
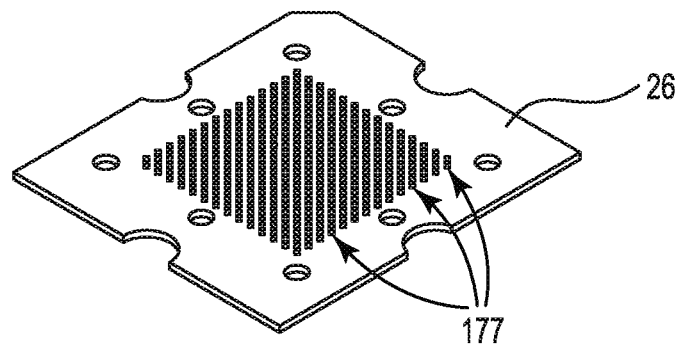
FIGS. 4A-4C show a perspective view, plan view, and a more detailed plan view of a portion thereof, respectively, of an exemplary embodiment of a socket contact holding layer substrate including a plurality of holding structures usable to provide an adapter apparatus such as the adapter apparatus of FIGS. 2A-2C.
Figure 4B:
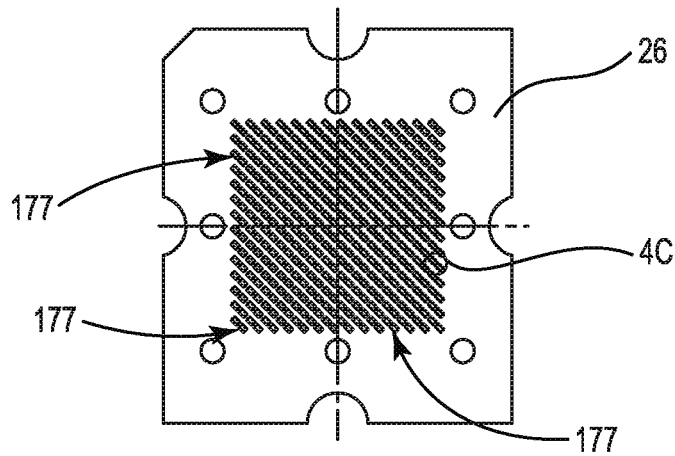
Figure 4C:
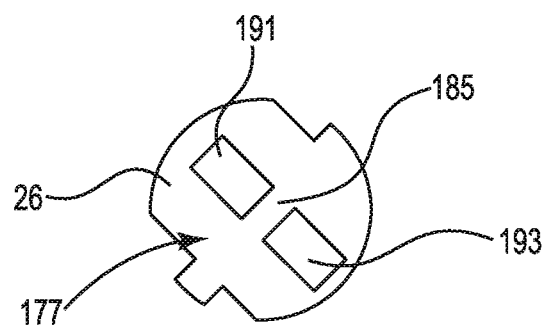

Yet further, as shown in FIGS. 1-4, the plurality of layers forming substrate 20 may include at least one socket contact holding layer 26 that includes a plurality of holding structures 177 (e.g., a holding element 185 separating a pair of openings 191, 193 such as shown in FIGS. 4A-4C). The at least one socket contact holding layer 26 is positioned between the at least one end connection retention guide layer and the at least one deflection element receiving layer (e.g., layer 26 may be in contact with one or more of such layers, or be separated therefrom by one or more other layers). The plurality of holding structures 177 may be used to hold a socket contact 40 (e.g., a flat socket contact) in the corresponding opening 15 of the substrate 20. For example, a portion of the at least one end connection retention guide layer 27 and one of the plurality of holding structures 177 of the socket contact holding layer 26 may be configured to hold the socket contact 40 in place, as opposed to the socket contact 40 being press-fit within the opening 15 (e.g., the holding structure may include holding element 185 positioned against the closed end 92 of the socket opening 61 of socket contact 40 and hold the socket contact 40 against one or more portions of the at least one end connection retention guide layer 27).

In one or more embodiments, as shown in FIGS. 1-4, the substrate 20 may include a plurality of openings 15 defined in any number of configurations (e.g., along columns and/or rows, defined diagonally relative to the x and y axes of the adapter (i.e., the x and y axes being orthogonal to the axis 43), defined at various locations, concentrated towards the edges and/or towards the center portion of the substrate, etc.). In other words, any number or configuration of the openings 15 may be used. In one or more embodiments, the deflectable element socket contacts need to be of a certain dimension to provide proper force and contact (e.g., enabling less resistance for current flow). To maintain a certain dimension of the adapter, the socket contacts may be held in openings arranged diagonally (e.g., relative to the x and y axes, relative to the side walls of the device package, etc.). Socket contacts arranged in such diagonal manner may reduce the space needed for such contacts (e.g., 1.414 times compared to the contacts positioned parallel to the x or y axes and being held along rows parallel to the x or y axes).

Further, each opening 15 of the plurality of openings may be provided in part by a deflection element receiving opening 30, as shown, for example, in FIGS. 3A-3D, defined through the deflection element receiving layer 21. Each of the deflection element receiving openings 30 may include a center pin receiving region 32 and the first and second deflection regions 34, 36. Generally, each of the first and second deflection regions 34, 36 are defined by one or more deflection region surfaces 35, 37, respectively, opposite the other and adjacent the center pin receiving region 32. In other words, the first and second deflection regions 34, 36 are defined on opposite sides of the center pin receiving region 32. Further, the center pin receiving region 32 may be defined by one or more pin receiving region surfaces 33 (e.g., two opposing surfaces located along axis 43 between the one or more deflection region surfaces 35, 37). Such center pin receiving region 32 and first and second deflection regions 34, 36 are defined in an open relationship to one another so as to form a continuous opening 30 through the at least one deflection element receiving layer 21 of substrate 20 (e.g., allowing portions of the socket contact 40 to be deflected or expand from the center pin receiving region 32 into first and second deflection regions 34, 36 when a male pin is inserted into the socket opening 61 of the socket contact 40). In the case of using additional deflection elements, such as, for example, a four deflectable element socket contact as described with reference to FIG. 7, additional deflection regions may be defined in an open relationship to one another so as to form a continuous opening through the at least one deflection element receiving layer of the substrate (e.g., allowing additional portions of the socket contact to be deflected or expand from the center pin receiving region into the various defined deflection regions when a male pin is inserted into the socket opening of the socket contact).

As shown in FIGS. 1-4, in or more embodiments, the openings 30 may be symmetric about a plane extending through and including axis 43 (e.g., a plane orthogonal to a cross-section taken perpendicularly to axis 43; or in other words, a plane extending into the page of FIG. 3D including axis 43). Further, in one or more embodiments, the various regions of the openings 30 may be defined using different diameter surfaces defining different portions thereof, for example, along axis 43. For example, in one or more embodiments, the center pin receiving region 32 may include a center cylindrical region along axis 43 having a diameter that is greater than the diameter of a male pin to be received therein. As shown in FIG. 3D, for example, such a center cylindrical region may be defined by opposing pin receiving region surfaces 33. Further, for example, in one or more embodiments, each of the first and second deflection regions 34, 36 may include a region that is not cylindrical along axis 43 (e.g., a rectangular region extending to the cylindrical region 32); however, any shape suitable to allow deflection as described herein may be used. In one or more embodiments, each of the regions defining the first and second deflection regions 34, 36 may have a cross-section area orthogonal to the axis 43 that is less than the diameter of the center cylindrical region defining the center pin receiving region 32. Still further, at least in one embodiment, the cross-sectional area of the first and second deflection regions 34, 36 are sized to allow for deflection of one or more portions of the socket contact 40 into such regions 34, 36.

One will recognize that the shape (e.g., cross-sectional shape) of the regions need not be cylindrical or rectangular but may be any cross-sectional shape (e.g., oval, elliptical, square, etc.) that provide suitable functionality as described further herein (e.g., allow for receiving a male pin, allow for deflection of portions of a deflectable element socket contact provided in the opening, etc.). In other words, various configurations of such openings with different defining surfaces may be used to allow for deflection of portions thereof when a male pin is received by the deflectable element socket contact 40. The various surfaces (e.g., deflection region surfaces 35, 37; pin receiving region surfaces 33, etc.) defining one or more regions of the openings 30 (or any other openings of any other layers described herein) may be formed by drilling one more holes or regions through the deflection element receiving layer 21, etching one or more holes or regions through the deflection element receiving layer 21, or any other suitable process.

Conductive deflectable element socket contacts 40 are provided (e.g., held, for example, using a plurality of holding structures 177) in each opening 15 defined through the substrate 20. The deflectable element socket contacts 40 may be provided in the openings 15 in any suitable manner (e.g., using any suitable structure, such as the plurality of holding structures 177 and the at least one end connection retention guide layer 27) so as to allow a male pin (e.g., such as elongated male pin 81) to be inserted into the center pin receiving region 32 and within the deflectable element socket contact 40 as described herein. For example, in one or more embodiments, such deflectable element socket contacts 40 may be positioned within the openings 15 using one or more apparatus such as described with reference to FIG. 6 and/or process steps or features described herein, which allow for the holding of the socket contacts 40 within the openings 15 without use of press-fitting techniques.

In at least one embodiment, each of the plurality of deflectable element socket contacts 40 is flat (e.g., including generally planar and parallel sides). Such socket contacts 40 may be formed in any suitable manner. For example, such deflectable element socket contacts 40 may be formed by etching (e.g., chemical and/or physical etching), stamping, conventional milling, laser cutting, etc. Such deflectable element socket contacts 40 may be formed, in one or more embodiments, from a planar layer of material having a thickness greater than 4 mils and/or less than two thirds the diameter of a male pin being received thereby. In one or more embodiments, the deflectable element socket contacts may be formed separately and/or together (e.g., as part of a structure such as shown in FIG. 6). Further, in another embodiment, the plurality of deflectable element socket contacts may include first and second flat socket portions such as described with reference to FIG. 7 to form a four deflectable element socket contact.

Further, in one or more embodiments, the deflectable element socket contacts may be formed using one or more suitable conductive materials for providing desired electrical conduction and one or more suitable deflectable material (e.g., one or more materials that have a certain degree of spring action, one or more materials that are deflectable by a force to a state other than normal and returnable to the normal state after the force is removed, etc.). For example, such conductive socket contacts (e.g., plated or solid) may be formed of brass alloy, beryllium/copper alloy, etc. Further, for example, such socket contacts may be plated using, for example, nickel, gold, rhodium, or any alloy thereof. For example, the deflectable element socket contacts 40 may be formed of beryllium copper alloy.

Figure 5A:
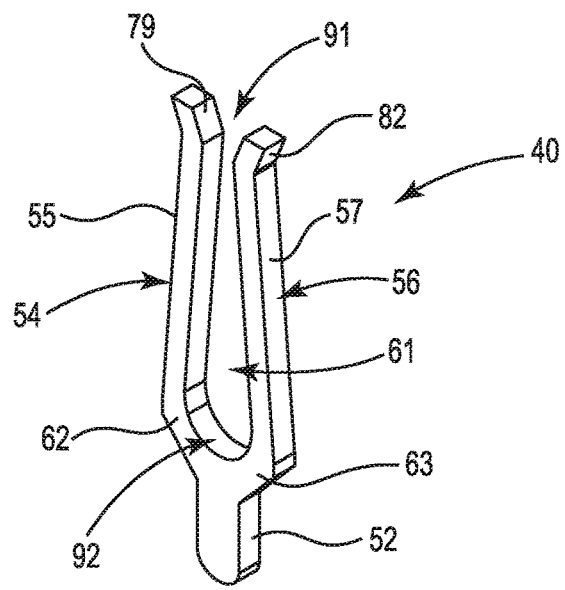
FIGS. 5A-5D show an illustrative perspective view, a plan view, a side view, and a top view of an exemplary deflectable element socket contact in its normal undeflected state for use in providing an adapter apparatus such as the adapter apparatus of FIGS. 2A-2C.
Figures 5B, 5C:
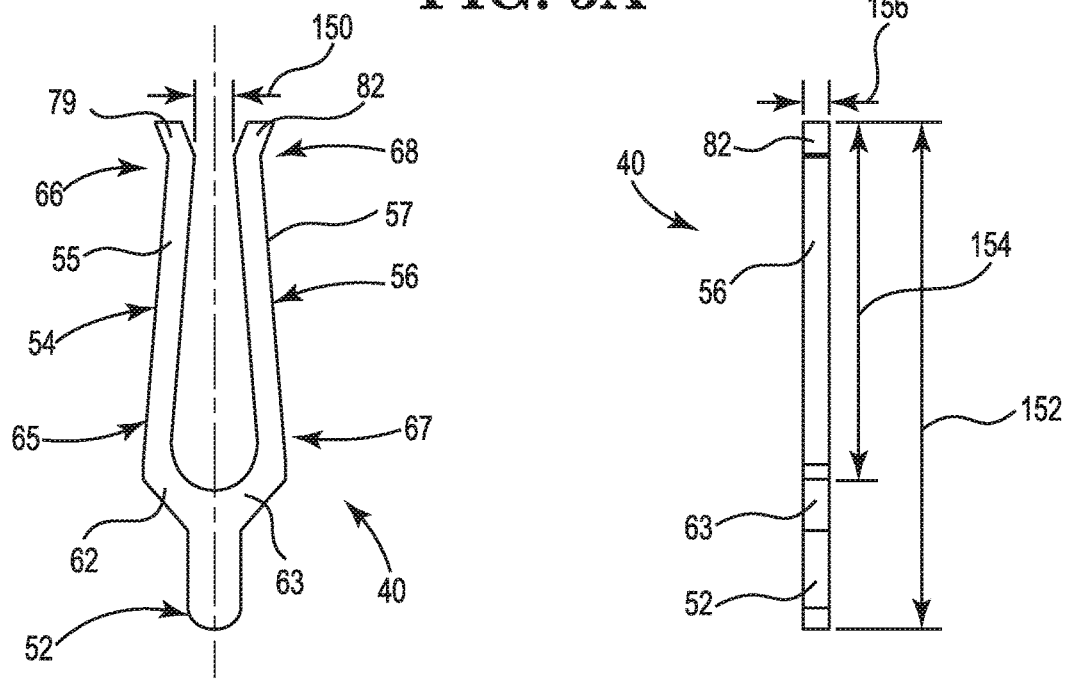
Figure 5D:
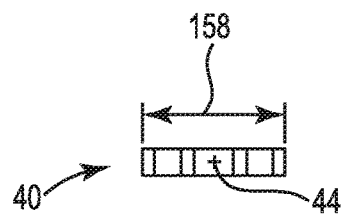

As shown in FIGS. 1 and 5, in one or more embodiments, each of the plurality of deflectable element socket contacts 40 may include an end connection portion 52 and first and second deflectable elements 54, 56. For example, the first deflectable element 54 may be coupled to the end connection portion 52 and provided at least partially in the first deflection region 34. Likewise, the second deflectable element 56 may be coupled to the end connection portion 52 and provided at least partially in the second deflection region 36. In one or more embodiments, the first and second deflectable elements 54, 56 may be configured to deflect within the first and second deflection regions 34, 36, respectively, when a male pin 81 is received in the pin receiving region 32 and in contact between the first and second deflectable elements 54, 56.

In one or more embodiments, the first and second deflectable elements 54, 56 are symmetrical about an axis 44. At least in one embodiment, the axis 44 is coincident with axis 43 of an opening 15 when the deflectable element socket contact 40 is provided therein. Further, the first and second deflectable elements 54, 56 may be spaced apart by a distance 150 suitable to receive a male pin 81 therebetween (e.g., based on the diameter of the male pin 81). Further, at least in one embodiment, the first and second deflectable elements 54, 56 may be spaced apart by a greater distance towards the connection side 24 of the substrate 20 than towards the pin receiving side 22 of the substrate 20. In one or more embodiments, the first and second deflectable elements 54, 56 may be spaced apart by a distance 150 that is less than the diameter of a male pin 81 to be received thereby (e.g., at a location towards the pin receiving side 22 of substrate 20). In at least one embodiment, the distance 150 may be greater than about 0.0045 inches and/or the distance 150 of the socket contact 40 may be less than about 0.006 inches.

As shown, for example, in FIGS. 1 and 5, each of the first and second deflectable elements 54, 56 may include an elongate portion 55, 57, respectively. In one or more embodiments, the elongate portion 55 of the first deflectable element 54 extends from a first end region 65 located within the first deflection region 34 and coupled to end connection portion 52 to a second end region 66 located at least in part within the pin receiving region 32. Likewise, for example, the elongate portion 57 of the second deflectable element 56 extends from a first end region 67 located within the first deflection region 36 and coupled to end connection portion 52 to a second end region 68 located at least in part within the pin receiving region 32. Further, at least in one embodiment, when positioned within a corresponding opening 15, the second end regions 66, 68 of each of the first and second deflectable elements 54, 56, respectively, are located towards the pin receiving side 22 of the substrate 20 and spaced at a distance from the one or more deflection region surfaces 35, 37 defining the first and second deflection regions 34, 36 (e.g., to allow for deflection of the second end regions 66, 68).

At least in one embodiment, each of the elongate portions 55, 57 of the first and second deflectable elements 54, 56, respectively, may be coupled to the end connection portion 52 by a transition portion 62, 63, respectively. At least in one embodiment, the transition portions 62, 63 assist in centering the holding structure 177 opposite the end connection portion 52 for use in positioning the socket contact 40 within a corresponding opening 15 of the substrate 20. Further, as described herein, for example, the holding structure 177 may be positioned and/or engage/contact the socket contact 40 between the transition portions 62,63 which couple the elongate portions of the first and second deflectable elements 54, 56 to the end connection portion 52 to hold the socket contact 40 in the corresponding opening 15 of the substrate 20 (e.g., the socket contact 40 may be indicated as being held in a floating condition without having an interference fit between the socket contact 40 and any of the surfaces defining opening 15). The holding structure 177 in conjunction with one or more portions of the at least one end connection retention guide layer 27 provide a certain degree of stability of the deflectable element socket contact 40 within the opening 15 (e.g., when a male pin 81 is being inserted into the socket contact 40).

In one or more embodiments, each of the first and second deflectable elements 54, 56 terminates towards the pin receiving side 22 of the substrate 20 at a chamfered region 79, 82, respectively, to assist in centering a male pin 81 when inserted into the pin receiving region 32 of the opening 30. The chamfered regions 79, 82 may take any form for assisting in receipt of the male pin 81. For example, the chamfered regions 79, 82 may be tapered in a direction away from axis 44; whereas the elongate portions 55, 57 have a taper from the connection side 24 of the substrate 20 to the pin receiving side 22 of the substrate 20 that tapers in a direction towards axis 44. At least in one embodiment, the intersection between the chamfered regions 79, 82 and the remainder of the first and second deflectable elements 54, 56, respectively, forms a shoulder for contact of the male pin 81 when inserted therebetween. Such shoulder may function to assist in stopping the insertion of the male pins 81 into the pin receiving regions 32. Each of the first and second deflectable elements 54, 56 (e.g., the chamfered regions 79, 82) may terminate towards the pin receiving side 22 of the substrate 20 (e.g., they may extend beyond the pin receiving side 22, may be flush with the pin receiving side 22, or terminate within the opening 30, for example, at a recessed distance from the pin receiving side 22).

The deflectable element socket contact 40 may be of various dimensions. In at least one embodiment, the total length 152 is as small as possible to provide the shortest electrical path. For example, in one or more embodiments, the total length 152 of the socket contact 40 may be greater than about 0.060 inches; the total length 152 of the socket contact 40 may be less than about 0.075 inches; the length 154 of the deflection element 55, 57 may be greater than about 0.05 inches; the length 154 of the deflection element 55, 57 (e.g., to allow low force contact with the pin) may be less than about 0.065 inches (e.g., the length 154 may be based on a length sufficient to apply an adequate force on the male pin 81 when inserted into the socket contact 40); the thickness 156 of the socket contact 40 may be greater than about 0.003 inches; the thickness 156 of the socket contact 40 (e.g., defined by manufacturability) may be less than about 0.005 inches; the width 158 of the socket contact 40 may be greater than about 0.018 inches; and the width 158 of the socket contact 40 (e.g., defined by the pith of two adjacent contacts) may be less than about 0.022 inches. In one or more embodiments, the length 154 of each of the first and second deflectable elements 54, 56 is at least twice the width 158.

The deflectable element socket contact 40, at least in one embodiment, may be referred to as a flat U-shaped socket contact defining a socket opening 61 for receiving a male pin (e.g., 81) having an open end 91 and a closed end 92 opposite the open and 91 (e.g., the closed-end being proximate the end connection portion 52). The open end 91 may be dimensionally configured such that a male pin inserted into the open end 91 of the socket contact 40 contacts and spreads or expands the structure forming the open end 91. The closed end 92 may be dimensionally configured to avoid contact with the male pin inserted within the socket contact 40 (e.g., the closed end 92 may have a radius associated therewith that is greater than the radius of the male pin 81). Further, the closed end 92 may be sized to engage with a portion of a holding structure 177 (e.g., each of the plurality of socket contacts 40 may be held in the corresponding opening 15 of the substrate 20 by a portion of the end connection retention guide layer 27 and a holding element 185 of one of the plurality of holding structures 177 of the socket contact holding layer 26 in contact with a portion of the closed end 92 within and/or adjacent the socket opening 61).

One will recognize that various portions of the deflectable element socket contact 40 need not be flat. For example, the elongate portions 55, 57, as well as other portions (e.g., such as the end connection portions) of the socket contact 40, may be cylindrical, elliptical, etc. Further, for example, the elongate portions 55, 57, as well as other portions of the socket contact 40, need not be a linear. For example, such portions may be nonlinear (e.g., curved, arcs, etc.). Still further, the deflectable element socket contact may include more than two deflectable elements. For example, any socket contact having deflectable elements defining a socket opening having an open end and a closed end may be held a corresponding opening of a substrate using features described herein.

End connection portion 52 may be of any suitable configuration allowing at least a portion thereof to be received with the end connection receiving openings 200 of the at least one end connection retention guide layer 27. For example, end connection portion 52 may be have a cross-section configured to match the cross-section of the end connection receiving openings 200 of the at least one end connection retention guide layer 27 (e.g., rectangular such as with a flat socket contact, cylindrical, etc.). However, in one or more other embodiments, such cross-sections need not be similar.

Further, for example, end connection portion 52 may be of any suitable configuration for providing contact, direct or indirect, with one or more conductive elements, such as conductive pads 14 on a target board 12 (e.g., a printed circuit board). For example, the end connection portion 52 may extend beyond or be flush with connection side 24 of substrate 20 and be directly or indirectly connected to one or more conductive elements. In other words, the end connection portion 52 may be soldered directly to a conductive element 14 on a target board 12, or may be indirectly connected to such a conductive element via one or more intermediate conductive structures or elements (e.g., solder balls, an adapter layer, etc.). Further, for example, in one or more embodiments, the connection portion 52 may be recessed relative to the connection side 24 of the substrate 20 and/or be flush therewith. For example, in such a configuration, one or more intermediate conductive structures or elements may be used to indirectly connect the end connection portion 52 to a conductive element 14 on target board 12. Still further, the end connection portion 52 may terminate in one or more various shapes (e.g., rectangular, elliptical, circular, etc.).

Still further, in one or more embodiments, the end connection portion 52 may be attached to a contact 14 on target board 12 by any suitable structure or process. At least in one embodiment, the end connection portion 52 may be configured for receipt of solder material (e.g., a solder ball, solder sphere, bump, or column) thereon. Depending on the type of material used to form the end connection portion 52 and the application of the adapter apparatus, at least in one embodiment, solder material may not be needed thereon (e.g., a gold end that can be otherwise soldered to the target board without the need to prevent the end from oxidation).

Openings may result in regions between the end connection portions 52 and the surfaces (e.g., surfaces 170 defining the end connection receiving openings 200 of the at least one end connection retention guide layer 27. At least in one embodiment, a blocking structure 97 (e.g., a blocking layer) may be provided at the connection side 24 of substrate 20 to prevent material (e.g., solder) from creeping or wicking up the end connection portions 52 into the openings along the end connection portions 52 of the socket contacts 40, such as when, for example, the adapter apparatus 10 is being soldered down and onto target board 12. If such creeping and/or wicking occur, the solder joint may be weakened.

The blocking structure 97 may be provided in any suitable form that blocks material from entering opening 15 at the connection side 24 (e.g., seals the socket pin tips). For example, at least in one embodiment, the blocking structure 97 may be a thin layer (e.g., about 2 mils thick) of electrically insulative material (e.g., Kapton material or tape) positioned at the connection side 24 with the end connection portions 52 extending therethrough. For example, in one or more embodiments, the layer of material 97 may be a layer having a plurality of slots formed therein (e.g., laser cut, etched, etc.) corresponding in size to the end connection portions 52 (e.g., the same or slightly smaller than the end connection portions 52 so as to block material from entering opening 15 when the layer is placed over the end connection portions 52 and onto the connection side 24 to cover open regions between the end connection portions 52 and the surfaces defining opening 15). Further, at least in one embodiment, the blocking structure 97 may include a layer of pre-preg material.

The deflectable element socket contacts 40, in one or more embodiments, may be configured for mounting in openings 15 of a substrate 20 where the pitch of the contacts of the adapter apparatus is in the range of about 0.3 mm to about 0.75 mm. The deflectable element socket contacts 40 may be configured (e.g., the first and second deflectable elements may be effectively spaced apart) so as to provide effective contact with a male pin 81 when the male pin 81 is inserted through the center pin receiving region 32 and between the first and second deflectable elements 54, 56. The conductive deflectable element socket contacts 40 shown in FIG. 1A-1B may be referred to as female sockets (e.g., female socket pins) mounted in corresponding openings 15 defined through substrate 20 for receiving male pins 81. In other words, as the adapter apparatus 10 includes female socket type contacts 40, a male pin adapter 80 may be used in conjunction therewith to mount a device (e.g., a BGA device 70) to the target board 12.

For example, as shown in FIGS. 1-2, in one or more embodiments, the male pin adapter 80 may include a substrate 82 with a plurality of male terminal pins 81 mounted therethrough. Each of the male terminal pins 81 may include a pin portion 84 configured to be received in the deflectable element socket contact 40 of adapter apparatus 10 and a contact portion 86 for providing electrical contact with a solder ball 72 of the device 70 (e.g., either directly or indirectly through another board, which may be an interposer, another adapter apparatus, etc.).

The male adapter apparatus 80 as shown in FIGS. 1A-1B and FIGS. 2B-2C may include the substrate 82 having a plurality of openings 90 defined therethrough for receiving and holding the plurality of male terminal pins 81 configured for mating with the adapter apparatus 10 (e.g., press-fit in the openings 90). The male adapter apparatus 80 may be configured in any suitable manner for presenting the pins to mate with the deflectable element socket contacts 40 of the adapter apparatus 10. For example, various components may be used to assist the mating of the male terminal pins 81 with the contacts 40. For example, one or more alignment structures may be used around the perimeter of the substrate 82 to align male pin adapter 80 with adapter apparatus 10 (e.g., and thus, alignment of the male pins 81 with the axis 43 of the openings 15 having contacts 40 therein).

Further, for example, as shown in FIGS. 1A-1B and not to be considered limiting to the disclosure presented herein, the adapter apparatus 10 may be employed to mount a packaged device 70 (e.g., a BGA package) to target board 12. Target board 12 may include a pattern of contact elements 14 corresponding to a plurality of solder balls 72 of the ball grid array device 70. The solder balls 72 may be provided on a pattern of contact pads of the ball grid array device 70.

Solder material, as used herein, may be any suitable type of solder material generally known in the art. Such suitability will generally depend on the application for which the adapter apparatus is being used. For example, the solder material may include solder balls as shown in FIGS. 1A-1B, solder films, solder spheres, partial solder spheres, solder columns, or any other suitable size and shape of material. Further, for example, the solder material may include eutectic 63/37 SnPb solder balls or solder spheres, or may be formed of lead free solder alloys such as SAC305 (Sn, Ag3.0, Cu0.5).

In one or more embodiments, the deflectable element socket contacts 40 when provided in corresponding openings 15 are generally in a normal state (e.g., when male pins 81 have not been inserted therein). Further, as the male pins 81 are inserted into the pin receiving regions 32 (e.g., centered by chamfered portions 79, 82) the deflectable elements 54, 56 expand into the deflection regions 34, 36, respectively, which move the deflectable element socket contacts 40 from their normal state into a deflected state where the deflectable element socket contacts 40 are effectively electrically connected with the male pins 81. In one or more embodiments, upon insertion of multiple male pins 81 into such deflectable element socket contacts 40, back forces on the multiple male pins 81 are created which effectively stop the insertion. For example, in at least one embodiment, the adapter is configured such that a gap (e.g., of a distance in the range of about 3 mils to about 5 mils) exists between the pin receiving side 22 of substrate 20 and the lower surface 89 of substrate 82 of pin adapter 80. Such a gap is beneficial such that the male adapter may be pulled out from the female socket using bent tools that are less than about 5 mils (e.g., inserted between the pin receiving side 22 and the bottom surface 89).

Figure 7:
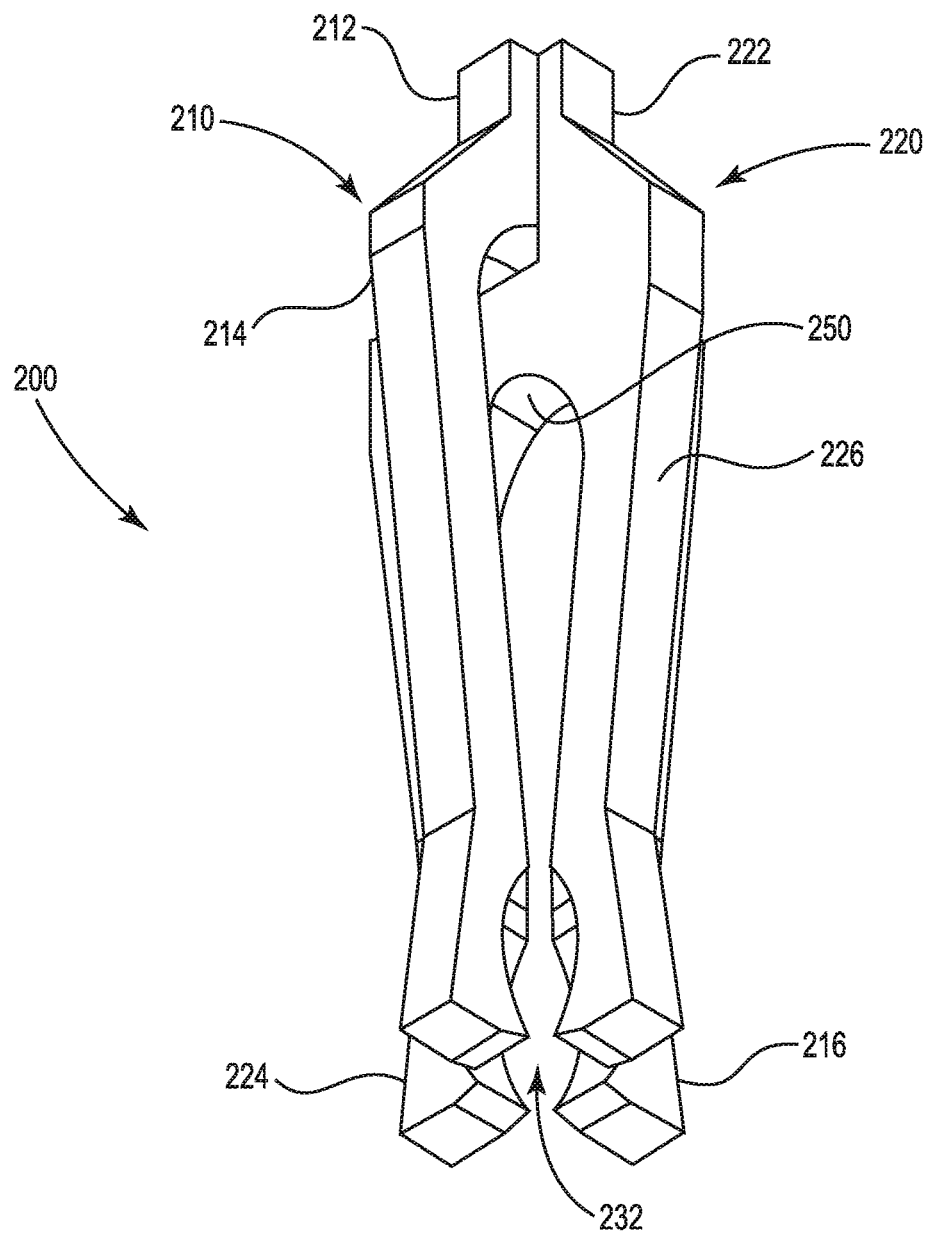
FIG. 7 shows an illustrative perspective view of an embodiment of yet another exemplary deflectable element socket contact in its normal undeflected state for use in providing an adapter apparatus.

Further, in one or more other embodiments, any number of deflectable elements in addition to the first and second deflectable elements may be used to form the socket contacts that float within the adapter apparatus as described herein. For example, as shown in FIG. 7, each of the plurality of deflectable element socket contacts may include a four deflectable element socket contact 200. For example, the four deflectable element socket contact 200 may include a first socket contact portion 210 and a second contact portion 220 (e.g., each may be a flat socket contact portion).

For example, the first socket contact portion 210 may include an end connection portion 212 and first and second deflectable elements 214, 216. For example, the first deflectable element 214 may be coupled to the end connection portion 212 and the second deflectable element 216 may be coupled to the end connection portion 212. Likewise, the second socket contact portion 220 may include an end connection portion 222 and third and fourth deflectable elements 224, 226. For example, the third deflectable element 224 may be coupled to the end connection portion 222 and the fourth deflectable element 226 may be coupled to the end connection portion 222. In one or more embodiments, the first, second, third and fourth deflectable elements 214, 216, 224, and 226 may be configured to deflect within various deflection regions of the adapter apparatus when a male pin is received in a pin receiving region 232 defined by the contact 200.

As shown in FIG. 7, the end connection portion 222 associated with the third and fourth deflectable elements 224, 226 may mate or otherwise be coupled to the end connection portion 212 associated with the first and second deflectable elements 214, 216 to define the pin receiving region and/or socket opening configured to receive a male pin therein (e.g., a portion of one end connection portion 212 may be configured to mate and/or slide into a groove or opening 260 defined in the other end connection portion 222). For example, the first and second deflectable elements 214, 216 and the end connection portion 212 associated therewith may be formed as a first flat contact portion 210 and, for example, the third and fourth deflectable elements 224, 226 and the end connection portion 222 associated therewith, may be formed as a second flat contact portion 220. Further, for example, the first and second flat contact portions 210, 220 may be arranged orthogonal to one another to provide a four deflectable element socket opening configured to receive the male pin therein.

Many of the features of second flat contact portion 220 may be the same as or similar to the features of the first contact portion 210 (which may be the same as and/or similar to flat contact socket 40) and will not be repeated herein. Further, for example, at least in one embodiment, a holding structure (like that of holding element 185 of holding structure 177 described herein) may be positioned and/or engage/contact the socket contact 200 at surface 250 between transition portions which couple the elongate portions of the third and fourth deflectable elements 224, 226 to the end connection portion 222 to hold the socket contact 200 in a corresponding opening (similar to opening 15) of a substrate 20 (e.g., the socket contact 200 may be indicated as being held in a floating condition without having an interference fit between the socket contact 200 and any of the surfaces defining such an opening). Such a similar holding structure 177 in conjunction with one or more portions of the at least one end connection retention guide layer 27 may provide a certain degree of stability of the four deflectable element socket contact 200 within such a similar opening 15 (e.g., when a male pin 81 is being inserted into the socket contact 200).

FIGS. 2B-2C show an exploded perspective view and an exploded side view, respectively, of one exemplary embodiment of components of the adapter apparatus 10 and male pin adapter 80, such as shown assembled in the perspective view of FIG. 2A. One or more embodiments of forming the adapter apparatus 10 shall be described with reference to such FIGS. 2B-2C as well as others figures referenced herein.

For example, the adapter apparatus 10 includes the substrate 20 which may be formed from a plurality of layers. Such layers may include the at least one end connection retention guide layer 27 that includes a plurality of end connection receiving openings 200, at least one deflection element receiving layer 21 that includes a plurality of deflection element receiving openings 30, and at least one socket contact holding layer 26 that includes a plurality of holding structures 177 (e.g., each holding structure 177 may include a holding element 185 and one or more openings defined adjacent thereto as shall be described with reference to FIGS. 4A-4C).

As illustratively provided herein, at least one embodiment of the at least one end connection retention guide layer 27 includes a plurality of end connection receiving openings 200 defined therethrough between a first side 401 and a second side 403 (e.g., the first side 401 may be adjacent a blocking structure 97 and the second side 403 may be configured for receiving the end connection portions 52 of socket contacts 40). The plurality of end connection receiving openings 200 are configured and/or sized to receive at least a part of an end connection portion 52 of a socket contact 40.

For example, as described herein, the end connection portion 52 may be recessed in the end connection receiving openings 200 after insertion therein, may be flush with the connection side 24 of the substrate 20, or may extend through and beyond the connection side 24 after insertion within the end connection receiving openings 200. At least in one embodiment, a length of the end connection portion 52 in the direction of an axis 43 along which the socket contact 40 lies may be greater than a thickness of the at least one end connection retention guide layer 27 in the direction of the axis 43 of the socket contact 40. In such a manner, for example, at least a part of the end connection portion 52 of each of the plurality of socket contacts 40 may extend through and out of the corresponding end connection receiving opening of the plurality of end connection receiving openings 200 of the at least one end connection retention guide layer 27.

One skilled in the art will recognize that the configuration of such end connection receiving openings 200 depend upon the end connection portion 52 of the socket contact 40 being received therein. At least in one embodiment, the end connection receiving openings 200 provide a guide to the end connection portions 52 such that they may be easily inserted therein (e.g., the cross-section of such openings 200 and the end connection portions 52 may be similar).

As illustratively provided herein, at least one embodiment of the at least one deflection element receiving layer 21 includes the plurality of deflection element receiving openings 30 defined therethrough between a first side 405 and a second side 407 (e.g., the first side 405 may be adjacent the at least one socket contact holding layer 26 when assembled and the second side 407 may be configured for receiving the male pins 81 of adapter 80). The deflection element receiving openings 30, as previously described herein, are configured to receive at least a part of deflectable elements 54 and 56 of a socket contact 40 and permit deflection of such deflectable elements 54 and 56 when a male pin 81 is received in the socket opening defined thereby. At least in one or more embodiments, the cross-section area of each of the plurality of end connection receiving openings 200 orthogonal to an axis 43 along which the socket contact 40 lies between the pin receiving side 22 and the connection side 24 may be smaller than a cross-section area of each of the plurality of deflection element receiving openings 30 orthogonal to the axis 43 along which the socket contact 40 lies (e.g., allowing one or more portions of the at least one end connection retention guide layer 27 to be adjacent and/or in contact with one or more portions of the socket contact 40, such as the transition regions 62, 63 thereof, when the adapter apparatus 10 is assembled).

Further, as illustratively provided herein, at least one embodiment of the at least one socket contact holding layer 26 includes a plurality of holding structures 177. The at least one socket contact holding layer 26 extends between a first side 409 and a second side 411 (e.g., the first side 409 may be adjacent the at least one end connection retention guide layer 27 when assembled and the second side 411 may be adjacent the first side 405 of the at least one deflection element receiving layer 21 when assembled).

One or more exemplary embodiments of the at least one socket contact holding layer 26 are shown in FIGS. 4A-4C. As shown therein, the at least one socket contact holding layer 26 includes the plurality of holding structures 177. Each of the plurality of holding structures 177 is configured to provide structure to retain a socket contact 40 within a corresponding opening 15 of the substrate 20. For example, each socket contact 40 (e.g., a flat socket contact) may be held in the corresponding opening 15 of the substrate 20 by a portion of the at least one end connection retention guide layer 27 and a holding structure 177. Any holding structures provided in an intermediate layer positioned between other layers and which function to provide for positioning and retaining of the socket contacts within corresponding openings of the substrate may be used (e.g., such holding structures may be capable of maintaining the socket contact in a somewhat floating condition within the opening 15 of the substrate without the socket contact being press-fit therein). Even though the socket contact 40 is not press fit in the opening 15 of the substrate 20, the socket contact 40 may still contact one or more surfaces defining the opening 15. However, such contact between the socket contact 40 and such surface defining the opening 15 does not provide an interference fit between the socket contact 40 and such surfaces.

For example, as shown in FIGS. 4A-4C, each of such holding structures 177 may include a holding element 185 having one or more openings 191, 193 adjacent thereto. For example, as shown in FIG. 4C, holding structure 177 may include a holding element 185 that separates two openings 191, 193. In such a configuration, when forming and assembling the adapter apparatus 10, such openings 191, 193 provide openings through which the first and second deflectable elements 54, 56 of the socket contact 40 are respectively inserted. However, other configurations of openings and holding elements may be used. For example, a similar configuration may be provided by a holding element projecting into a single opening, by a holding element that has counter features as part of the socket contact 40 (e.g., mating features between the socket contact 40 and the holding element), etc.

With the plurality of layers used to form the substrate 20 being provided, and also a plurality of socket contacts 40 being provided (e.g., socket contacts that may include an end connection portion 52 and first and second deflectable elements 54, 56 coupled to the end connection portion 52 to define a socket opening 61 configured to receive a male pin 81 therein), the process of forming the adapter apparatus 10 may be implemented using any number of processing steps; some of such steps need not be performed in the order as described herein.

For example, such forming of the adapter apparatus 10 may include coupling the at least one socket contact holding layer 26 and the at least one deflection element receiving layer 21. For example, the at least one socket contact holding layer 27 may be coupled to the at least one deflection element receiving layer 21 such that the one or more openings (e.g., 191, 193) of each holding structure 177 of the plurality of holding structures 177 are aligned with a corresponding deflection element receiving opening 30 of the plurality of deflection element receiving openings 30. In such a manner, the second side 411 of the at least one socket contact holding layer 26 is positioned adjacent the first side 405 of the at least one deflection element receiving layer 21.

Such alignment of these layers and/or features thereof, as well as other layers described herein and/or features thereof, may be accomplished using any known manufacturing techniques, such as pins and alignment holes associated with such layers or assembly equipment (e.g., some of which are shown in the figures described herein but not provided with reference numerals). Further, when layers are described as being adjacent herein, such layers need not be in contact with one another, but rather, one or more additional layers may be positioned therebetween.

Further, to form the adapter apparatus 10, the first and second deflectable elements 54, 56 of each of the plurality of socket contacts 40 are inserted through the one or more openings (e.g., 191, 193) of a corresponding holding structure 177 of the plurality of holding structures of the at least one socket contact holding layer 26. For example, first deflectable element 54 of a socket contact 40 may be inserted through opening 191 and second deflectable element 56 may be inserted through opening 193. As such, the holding element 185 of the holding structure 177 is positioned within the socket opening 61 defined by the socket contact 40. It will be recognized that such an insertion process may be performed before coupling the at least one socket contact holding layer 26 and the at least one deflection element receiving layer 21. Similarly, in one or more other embodiments, when forming an adapter apparatus using additional deflectable elements (e.g., when forming the adapter apparatus using the four deflectable element socket contacts), such additional deflectable elements, e.g., such as third and fourth deflectable elements, would also be inserted such that they may be held in the adapter in a floating configuration using components similar to the holding element 185 of the holding structure 177.

At least in one or more embodiments, for example, with the coupled layers 21 and 26 in a configuration where the openings (e.g., 191, 193) of the at least one socket contact holding layer 26 are positioned upward (or when the insertion is performed before such coupling), the plurality of socket contacts 40 may be dropped into the one or more openings (e.g., 191, 193) such that the closed portion 92 of the socket contact 40 contacts the holding element 185. In such a manner, the socket contacts 40 substantially hang from the holding elements 185 with the first and second deflectable elements 54, 56 of the socket contacts 40 positioned within the deflection element receiving opening 30 of the at least one deflection element receiving layer 21. Such insertion results in the end connection portions 52 of the socket contacts 40 being exposed (e.g., extending beyond the first side 409 of the at least one socket contact holding layer 26. In other words, the socket contacts 40 are inserted such that the holding element 185 of the corresponding holding structure 177 is in contact with a portion of the socket contact 40 within and/or adjacent the socket opening 61 and the first and second deflectable elements 54, 56 of the socket contact 40 are located within a corresponding deflection element receiving opening 30 of the plurality of deflection element receiving openings 30 of the at least one deflection element receiving layer 21.

Thereafter, to further form the adapter apparatus 10, the at least one end connection retention guide layer 27 is coupled to the at least one socket contact holding layer 26 such that at least a part of the end connection portion 52 of each of the plurality of socket contacts 40 is received within a corresponding end connection receiving opening 200 of the plurality of end connection receiving openings 200 of the at least one end connection retention guide layer 27. For example, at least in one embodiment, the plurality of end connection receiving openings 200 of the at least one end connection retention guide layer 27 are guided onto the exposed end connection portions 52 of the socket contacts 40.

One skilled in art will recognize that various techniques for coupling the various layers together may be used to form the adapter apparatus 10. For example, lamination type processes may be used, curing processes may be used (e.g., thermal curing, chemical curing, UV curing, room temperature curing, pressure curing, etc., along with various alignment techniques. At least in one embodiment, the at least one end connection retention guide layer 27 may be coupled to the at least one socket contact holding layer 26 using a layer of pre-preg material (e.g., provided as part of the guide layer 27 or as part of the socket contact holding layer 26). For example, the partially cured layer of pre-preg material (e.g., 29) may be used to provide additional prevention of wicking along the socket contact 40.

The socket contact 40 may be described as being held within the corresponding opening 15 of the substrate 20 in various manners with use of the holding structure 177. For example, each of the plurality of socket contacts 40 may be described as being held in the corresponding opening 15 of the substrate 20 by a portion of the at least one end connection retention guide layer 27 and a holding element 185 of one of the plurality of holding structures 177 of the socket contact holding layer 26 extending within at least part of the socket opening 61 proximate the coupling of the first and second deflectable elements 54, 56 to the end connection portion 52. For example, the holding element 185 may be in contact with a portion of the socket contact 40 adjacent the socket opening 61 to provide containment of the socket contact 40 in a first direction and regions of the at least one end connection retention guide layer 27 proximate and adjacent, for example, the transition portions 62, 63 of the socket contact 40, may provide containment of the socket contact 40 within the opening 15 in a second direction opposite the first direction.

Further, for example, each of the plurality of socket contacts 40 have been described as including an open end 91 configured to receive the male pin 81 therein and a closed end 92 opposite the open end 91 and towards the end connection portion 52 of the socket contact 40. Each of the plurality of socket contacts 40 may be described as being held in the corresponding opening 15 of the substrate 20 by a portion of the end connection retention guide layer 27 and a holding element 185 of one of the plurality of holding structures 177 of the socket contact holding layer 26 in contact with a portion of the closed end 92. Again the end connection retention guide layer 27 and the holding element 185 provide containment in opposite directions to retain the socket contact 40 within the corresponding opening 15.

Still further, each of the plurality of socket contacts 40 may be described as being held in the corresponding opening 15 of the substrate 20 by a holding element 185 of one of the plurality of holding structures 177 that is positioned between the transition portions 62, 63 coupling the elongate portions of the first and second deflectable elements 54, 56 to the end connection portion 52 and in contact with the socket contact 40 to hold the socket contact 40 in the corresponding opening 15 of the substrate 20.

Yet still further, in one or more embodiments, at least a portion of each of the plurality of socket contacts 40 may be described as being sandwiched between a holding element 185 of one of the plurality of holding structures 177 of the at least one socket contact holding layer 26 and one or more portions of the at least one end connection retention guide layer 27 (e.g., regions of the at least one end connection retention guide layer 27 proximate and adjacent, for example, the transition portions 62, 63 of the socket contact 40).

The deflectable element socket contacts 40 may be provided for assembly in one of various manners (e.g., as separate contacts, as a plurality of space apart contacts, etc.). For example, at least in one embodiment, the plurality of deflectable element socket contacts may be provided as shown in FIGS. 6A-6C. FIGS. 6A-6C show a plan view, a side view, and a more detailed view of a portion of the side view, respectively, of another exemplary embodiment of a plurality of deflectable element socket contacts 112 attached to a removable holding member 117 usable to provide an adapter apparatus such as the adapter apparatus of FIGS. 2A-2C.

As shown in FIGS. 6A-6C, the holding member 117 holds the deflectable element socket contacts 112 at a suitable distance 131 from each other. Such distance 131, for example, may be dependent upon the spacing of corresponding openings 15 into which the socket contacts 112 are to be inserted. The end connection portions 132 of each socket contact 112 are attached to the holding member 117 along a break line 133 with the open end of such socket contacts 112 being free of connection material. In such a manner, upon insertion of the plurality of socket contacts 112 into openings of the at least one socket contact holding layer 26 (e.g., dropping them such that they hang from the holding elements 185), the holding member 117 may be removed by mechanical action along the break line 133 (e.g., snapped off, etc.) leaving the socket contacts 112 within the corresponding openings 30.

All patents, patent documents, and references cited herein are incorporated in their entirety as if each were incorporated separately. This disclosure has been provided with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the invention, will be apparent to persons skilled in the art upon reference to this description.

The invention claimed is:

1. An adapter apparatus comprising:
   a substrate having a pin receiving side and a connection side opposite the pin receiving side, wherein a plurality of openings are defined through the substrate between the pin receiving side and the connection side, and further wherein the substrate comprises a plurality of layers, wherein the plurality of layers comprise:
      at least one end connection retention guide layer comprising a plurality of end connection receiving openings,
      at least one deflection element receiving layer comprising a plurality of deflection element receiving openings, and
      at least one socket contact holding layer comprising a plurality of holding structures positioned between the at least one end connection retention guide layer and the at least one deflection element receiving layer; and
   a plurality of socket contacts, wherein each of the plurality of socket contacts is provided within a corresponding opening of the plurality of openings of the substrate, wherein each of the plurality of socket contacts comprises:
      an end connection portion, wherein at least a part of the end connection portion is received in one of the plurality of end connection receiving openings, and
      first and second deflectable elements configured to be received in one of the plurality of deflectable element receiving openings, wherein the first deflectable element and the second deflectable element are coupled to the end connection portion to define a socket opening configured to receive a male pin therein, wherein the socket contact is held in the corresponding opening of the substrate by a portion of the end connection retention guide layer and one of the plurality of holding structures of the socket contact holding layer, and further wherein the first and second deflectable elements deflect when a male pin is received in the socket opening and in contact between the first and second deflectable elements, wherein each of the plurality of holding structures of the at least one socket contact holding layer comprises a holding element separating a pair of openings through which the first and second deflectable elements are respectively inserted.

2. The adapter apparatus of claim 1, wherein the socket contacts are flat.

3. The adapter apparatus of claim 1, wherein a cross-section area of each of the plurality of end connection receiving openings orthogonal to an axis along which the socket contact lies between the pin receiving side and the connection side is smaller than a cross-section area of each of the plurality of deflection element receiving openings orthogonal to the axis along which the socket contact lies.

4. An adapter apparatus comprising:
   a substrate having a pin receiving side and a connection side opposite the pin receiving side, wherein a plurality of openings are defined through the substrate between the pin receiving side and the connection side, and further wherein the substrate comprises a plurality of layers, wherein the plurality of layers comprise:
      at least one end connection retention guide layer comprising a plurality of end connection receiving openings,
      at least one deflection element receiving layer comprising a plurality of deflection element receiving openings, and
      at least one socket contact holding layer comprising a plurality of holding structures positioned between the at least one end connection retention guide layer and the at least one deflection element receiving layer; and
   a plurality of socket contacts, wherein each of the plurality of socket contacts is provided within a corresponding opening of the plurality of openings of the substrate, wherein each of the plurality of socket contacts comprises:
      an end connection portion, wherein at least a part of the end connection portion is received in one of the plurality of end connection receiving openings, and
      first and second deflectable elements configured to be received in one of the plurality of deflectable element receiving openings, wherein the first deflectable element and the second deflectable element are coupled to the end connection portion to define a socket opening configured to receive a male pin therein, wherein the socket contact is held in the corresponding opening of the substrate by a portion of the end connection retention guide layer and one of the plurality of holding structures of the socket contact holding layer, and further wherein the first and second deflectable elements deflect when a male pin is received in the socket opening and in contact between the first and second deflectable elements, wherein each of the plurality of socket contacts is held in the corresponding opening of the substrate by a portion of the at least one end connection retention guide layer and a holding element of one of the plurality of holding structures of the socket contact holding layer extending within at least part of the socket opening proximate the coupling of the first and second deflectable elements to the end connection portion.

5. An adapter apparatus comprising:
a substrate having a pin receiving side and a connection side opposite the pin receiving side, wherein a plurality of openings are defined through the substrate between the pin receiving side and the connection side, and further wherein the substrate comprises a plurality of layers, wherein the plurality of layers comprise:
  at least one end connection retention guide layer comprising a plurality of end connection receiving openings,
  at least one deflection element receiving layer comprising a plurality of deflection element receiving openings, and
  at least one socket contact holding layer comprising a plurality of holding structures positioned between the at least one end connection retention guide layer and the at least one deflection element receiving layer; and
a plurality of socket contacts, wherein each of the plurality of socket contacts is provided within a corresponding opening of the plurality of openings of the substrate, wherein each of the plurality of socket contacts comprises:
  an end connection portion, wherein at least a part of the end connection portion is received in one of the plurality of end connection receiving openings, and
  first and second deflectable elements configured to be received in one of the plurality of deflectable element receiving openings, wherein the first deflectable element and the second deflectable element are coupled to the end connection portion to define a socket opening configured to receive a male pin therein, wherein the socket contact is held in the corresponding opening of the substrate by a portion of the end connection retention guide layer and one of the plurality of holding structures of the socket contact holding layer, and further wherein the first and second deflectable elements deflect when a male pin is received in the socket opening and in contact between the first and second deflectable elements, wherein each of the plurality of socket contacts comprises an open end configured to receive the male pin therein and a closed end opposite the open end and towards the end connection portion of the socket contact, wherein the each of the plurality of socket contacts is held in the corresponding opening of the substrate by a portion of the at least one end connection retention guide layer and a holding element of one of the plurality of holding structures of the at least one socket contact holding layer in contact with a portion of the closed end.

6. An adapter apparatus comprising:
a substrate having a pin receiving side and a connection side opposite the pin receiving side, wherein a plurality of openings are defined through the substrate between the pin receiving side and the connection side, and further wherein the substrate comprises a plurality of layers, wherein the plurality of layers comprise:
  at least one end connection retention guide layer comprising a plurality of end connection receiving openings,
  at least one deflection element receiving layer comprising a plurality of deflection element receiving openings, wherein each of the plurality of deflection element receiving openings comprises a center pin receiving region and first and second deflection regions, wherein each of the first and second deflection regions are defined by one or more deflection region surfaces opposite the other and adjacent the center pin receiving region, and
  at least one socket contact holding layer comprising a plurality of holding structures positioned between the at least one end connection retention guide layer and the at least one deflection element receiving layer; and
a plurality of socket contacts, wherein each of the plurality of socket contacts is provided within a corresponding opening of the plurality of openings of the substrate, wherein each of the plurality of socket contacts comprises:
  an end connection portion, wherein at least a part of the end connection portion is received in one of the plurality of end connection receiving openings, and
  first and second deflectable elements configured to be received in one of the plurality of deflectable element receiving openings, wherein the first deflectable element and the second deflectable element are coupled to the end connection portion to define a socket opening configured to receive a male pin therein, wherein the socket contact is held in the corresponding opening of the substrate by a portion of the end connection retention guide layer and one of the plurality of holding structures of the socket contact holding layer, and further wherein the first and second deflectable elements deflect when a male pin is received in the socket opening and in contact between the first and second deflectable elements,
wherein the first deflectable element is coupled to the end connection portion and provided at least partially in the first deflection region and the second deflectable element is coupled to the end connection portion and provided at least partially in the second deflection region, and
wherein the first and second deflectable elements are spaced apart by a greater distance towards the connection side of the substrate than towards the pin receiving side of the substrate, the first and second deflectable elements being spaced apart by a distance that is less than the diameter of a male pin to be received thereby towards the pin receiving side of the substrate,
wherein each of the first and second deflectable elements comprises an elongate portion coupled to the end connection portion by a transition portion, the end connection portion being centered at the connection side of the substrate relative to the center pin receiving region, and further wherein a holding element of one of the plurality of holding structures is positioned between the transition portions coupling the elongate portions of the first and second deflectable elements to the end connection portion and in contact with the socket contact to hold the socket contact in the corresponding opening of the substrate.

7. The adaptor of claim 1, wherein a length of the end connection portion in the direction of an axis along which the socket contact lies between the pin receiving side and the connection side is greater than a thickness of the at least one end connection retention guide layer in the direction of the axis of the socket contact.

8. An adapter apparatus comprising:
a substrate having a pin receiving side and a connection side opposite the pin receiving side, wherein a plurality of openings are defined through the substrate between the pin receiving side and the connection side, and further wherein the substrate comprises a plurality of layers, wherein the plurality of layers comprise:
  at least one end connection retention guide layer comprising a plurality of end connection receiving openings,
  at least one deflection element receiving layer comprising a plurality of deflection element receiving openings, and
  at least one socket contact holding layer comprising a plurality of holding structures positioned between the at least one end connection retention guide layer and the at least one deflection element receiving layer; and
a plurality of socket contacts, wherein each of the plurality of socket contacts is provided within a corresponding opening of the plurality of openings of the substrate, wherein each of the plurality of socket contacts comprises:
  an end connection portion, wherein at least a part of the end connection portion is received in one of the plurality of end connection receiving openings, and
  first and second deflectable elements configured to be received in one of the plurality of deflectable element receiving openings, wherein the first deflectable element and the second deflectable element are coupled to the end connection portion to define a socket opening configured to receive a male pin therein, wherein the socket contact is held in the corresponding opening of the substrate by a portion of the end connection retention guide layer and one of the plurality of holding structures of the socket contact holding layer, and further wherein the first and second deflectable elements deflect when a male pin is received in the socket opening and in contact between the first and second deflectable elements, wherein at least a portion of each of the plurality of socket contacts is sandwiched between a holding element of one of the plurality of holding structures of the at least one socket contact holding layer and one or more portions of the at least one end connection retention guide layer.

9. An adapter apparatus comprising:
a substrate having a pin receiving side and a connection side opposite the pin receiving side, wherein a plurality of openings are defined through the substrate between the pin receiving side and the connection side, and further wherein the substrate comprises a plurality of layers, wherein the plurality of layers comprise:
  at least one end connection retention guide layer comprising a plurality of end connection receiving openings,
  at least one deflection element receiving layer comprising a plurality of deflection element receiving openings, and
  at least one socket contact holding layer comprising a plurality of holding structures positioned between the at least one end connection retention guide layer and the at least one deflection element receiving layer; and
a plurality of socket contacts, wherein each of the plurality of socket contacts is provided within a corresponding opening of the plurality of openings of the substrate, wherein each of the plurality of socket contacts comprises:
  an end connection portion, wherein at least a part of the end connection portion is received in one of the plurality of end connection receiving openings, and
  first and second deflectable elements configured to be received in one of the plurality of deflectable element receiving openings, wherein the first deflectable element and the second deflectable element are coupled to the end connection portion to define a socket opening configured to receive a male pin therein, wherein the socket contact is held in the corresponding opening of the substrate by a portion of the end connection retention guide layer and one of the plurality of holding structures of the socket contact holding layer, and further wherein the first and second deflectable elements deflect when a male pin is received in the socket opening and in contact between the first and second deflectable elements, wherein each of the plurality of socket contacts are not press-fit within a corresponding opening of the plurality of openings of the substrate.

10. An adapter apparatus comprising:
a substrate having a pin receiving side and a connection side opposite the pin receiving side, wherein a plurality of openings are defined through the substrate between the pin receiving side and the connection side, and further wherein the substrate comprises a plurality of layers, wherein the plurality of layers comprise:
  at least one end connection retention guide layer comprising a plurality of end connection receiving openings,
  at least one deflection element receiving layer comprising a plurality of deflection element receiving openings, and
  at least one socket contact holding layer comprising a plurality of holding structures positioned between the at least one end connection retention guide layer and the at least one deflection element receiving layer; and
a plurality of socket contacts, wherein each of the plurality of socket contacts is provided within a corresponding opening of the plurality of openings of the substrate, wherein each of the plurality of socket contacts comprises:
  an end connection portion, wherein at least a part of the end connection portion is received in one of the plurality of end connection receiving openings, and
  first and second deflectable elements configured to be received in one of the plurality of deflectable element receiving openings, wherein the first deflectable element and the second deflectable element are coupled to the end connection portion to define a socket opening configured to receive a male pin therein, wherein the socket contact is held in the corresponding opening of the substrate by a portion of the end connection retention guide layer and one of the plurality of holding structures of the socket contact holding layer, and further wherein the first and second deflectable elements deflect when a male pin is received in the socket opening and in contact between the first and second deflectable elements, wherein each of the plurality of socket contacts comprises:
the first and second deflectable elements and end portion coupled thereto formed as a first flat contact portion; and
third and fourth deflectable elements and an end connection portion associated therewith formed as a second flat contact portion, wherein the first and second flat contact portions are arranged orthogonal to one another to provide a four deflectable element socket opening configured to receive a male pin therein.

11. A method for use in forming an adapter apparatus, wherein the method comprises:
providing a plurality of layers, wherein the plurality of layers comprise:
at least one end connection retention guide layer comprising a plurality of end connection receiving openings,
at least one deflection element receiving layer comprising a plurality of deflection element receiving openings, and
at least one socket contact holding layer comprising a plurality of holding structures, each holding structure comprising a holding element and one or more openings defined adjacent thereto;
providing a plurality of socket contacts, wherein each of the plurality of socket contacts comprises:
an end connection portion, wherein at least a part the end connection portion is configured to be received in one of the plurality of end connection receiving openings, and
first and second deflectable elements configured to be received in one of the plurality of deflectable element receiving openings, wherein the first deflectable element and the second deflectable element are coupled to the end connection portion to define a socket opening configured to receive a male pin therein;
coupling the at least one socket contact holding layer and the at least one deflection element receiving layer such that the one or more openings of each holding structure of the plurality of holding structures are aligned with a corresponding deflection element receiving opening of the plurality of deflection element receiving openings;
inserting the first and second deflectable elements of each of the plurality of socket contacts through one or more openings of a corresponding holding structure of the plurality of holding structures of the socket contact holding layer such that the holding element of the corresponding holding structure is in contact with a portion of the socket contact with the socket cavity; and
coupling the at least one end connection retention guide layer to the socket contact holding layer such that at least a part of the end connection portion of each of the plurality of socket contacts is received within a corresponding end connection receiving opening of the plurality of end connection receiving openings of the at least one end connection retention guide layer, wherein the first and second deflectable elements of the socket contact are located within a corresponding deflection element receiving opening of the plurality of deflection element receiving openings of the at least one deflection element receiving layer.

12. The method of claim 11, wherein the socket contacts are flat.

13. The method of claim 11, wherein a cross-section area of each of the plurality of end connection receiving openings orthogonal to an axis along which the socket contact is smaller than a cross-section area of each of the plurality of deflection element receiving openings orthogonal to the axis along which the socket contact lies.

14. The method of claim 11, wherein each of the plurality of holding structures of the at least one socket contact holding layer comprises a holding element separating a pair of openings, wherein inserting the first and second deflectable elements of the each socket contact through one or more openings of a corresponding holding structure comprises inserting each of the first and second deflectable elements of each of the plurality of socket contacts through respective openings of the pair of openings.

15. The method of claim 11, wherein each of the plurality of socket contacts is held in the corresponding opening of the substrate by a portion of the at least one end connection retention guide layer and a holding element of one of the plurality of holding structures of the at least one socket contact holding layer extending within at least part of the socket opening proximate the coupling of the first and second deflectable elements to the end connection portion.

16. The method of claim 11, wherein each of the plurality of socket contacts comprises an open end configured to receive the male pin therein and a closed end opposite the open end and towards the end connection portion of the socket contact, wherein the each of the plurality of socket contacts is held in the corresponding opening of the substrate by a portion of the at least one end connection retention guide layer and a holding element of one of the plurality of holding structures of the at least one socket contact holding layer in contact with a portion of the closed end.

17. The method of claim 11, wherein each of the plurality of deflection element receiving openings comprises:
a center pin receiving region, and
first and second deflection regions, wherein each of the first and second deflection regions are defined by one or more deflection region surfaces opposite the other and adjacent the center pin receiving region;
wherein the first deflectable element is coupled to the end connection portion and provided at least partially in the first deflection region and the second deflectable element is coupled to the end connection portion and provided at least partially in the second deflection region, and
wherein the first and second deflectable elements are spaced apart by a greater distance towards the connection side of the substrate than towards the pin receiving side of the substrate, the first and second deflectable elements being spaced apart by a distance that is less than the diameter of a male pin to be received thereby towards the pin receiving side of the substrate,
wherein each of the first and second deflectable elements comprises an elongate portion coupled to the end connection portion by a transition portion, the end connection portion being centered at the connection side of the substrate relative to the center pin receiving region, and further wherein a holding element of one of the plurality of holding structures is positioned between the transition portions coupling the elongate portions of the first and second deflectable elements to the end connection portion and in contact with the socket contact to hold the socket contact in the corresponding opening of the substrate.

18. The method of claim 11, wherein a length of the end connection portion in the direction of an axis along which the socket contact lies is greater than a thickness of the at least one end connection retention guide layer in the direction of the axis of the socket contact, such that at least a part of the end connection portion of each of the plurality of socket contacts extends through and out of the corresponding end connection receiving opening of the plurality of end connection receiving openings of the at least one end connection retention guide layer.

19. The method of claim 11, wherein coupling the at least one end connection retention guide layer to the socket contact holding layer comprises using a layer of pre-preg material to couple the at least one end connection retention guide layer to the at least one socket contact holding layer.

20. The method of claim 11, wherein at least a portion of each of the plurality of socket contacts is sandwiched between a holding element of one of the plurality of holding structures of the at least one socket contact holding layer and one or more portions of the at least one end connection retention guide layer.

\* \* \* \* \*